(12) United States Patent
Tada

(10) Patent No.: US 12,068,423 B2
(45) Date of Patent: Aug. 20, 2024

(54) DETECTION DEVICE WITH HEATING ELECTRODE

(71) Applicant: Japan Display Inc., Tokyo (JP)

(72) Inventor: Masahiro Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/970,058

(22) Filed: Oct. 20, 2022

(65) Prior Publication Data

US 2023/0125919 A1 Apr. 27, 2023

(30) Foreign Application Priority Data

Oct. 26, 2021 (JP) .................. 2021-174996

(51) Int. Cl.
*H01L 31/024* (2014.01)
*H01L 31/0224* (2006.01)
*H01L 31/102* (2006.01)
*H01L 31/16* (2006.01)

(52) U.S. Cl.
CPC .... *H01L 31/024* (2013.01); *H01L 31/022408* (2013.01); *H01L 31/102* (2013.01); *H01L 31/165* (2013.01)

(58) Field of Classification Search
CPC ........... H01L 31/024; H01L 31/022408; H01L 31/102; H01L 31/165; H01L 27/1446; H01L 27/14601; H01L 27/14609; H10K 30/81; H10K 39/18

USPC .................. 250/216, 208.1, 214 R
See application file for complete search history.

(56) References Cited

U.S. PATENT DOCUMENTS

| | | | | |
|---|---|---|---|---|
| 11,322,547 | B2* | 5/2022 | Uchino | ............ H01L 27/14609 |
| 2004/0008984 | A1* | 1/2004 | Gerrish | ............... H04B 10/077 |
| | | | | 398/209 |
| 2013/0294766 | A1* | 11/2013 | Cai | ......................... H01L 31/18 |
| | | | | 438/69 |
| 2021/0326623 | A1* | 10/2021 | Kato | ................. H01L 27/14612 |

FOREIGN PATENT DOCUMENTS

| | | | |
|---|---|---|---|
| JP | 2016-164787 A | 9/2016 | |
| WO | WO-2020137129 A1 * | 7/2020 | ............ G01J 1/0492 |

* cited by examiner

*Primary Examiner* — Thanh Luu
*Assistant Examiner* — Mai Thi Ngoc Tran
(74) *Attorney, Agent, or Firm* — K&L Gates LLP

(57) ABSTRACT

A detection device includes a photoelectric conversion portion in which a plurality of photodiodes are arranged in a planar shape, a light source configured to irradiate the photodiodes with light, and a heating electrode provided so as to face the photoelectric conversion portion, and configured to generate heat and conduct the heat to the photoelectric conversion portion.

8 Claims, 23 Drawing Sheets

FIG.3
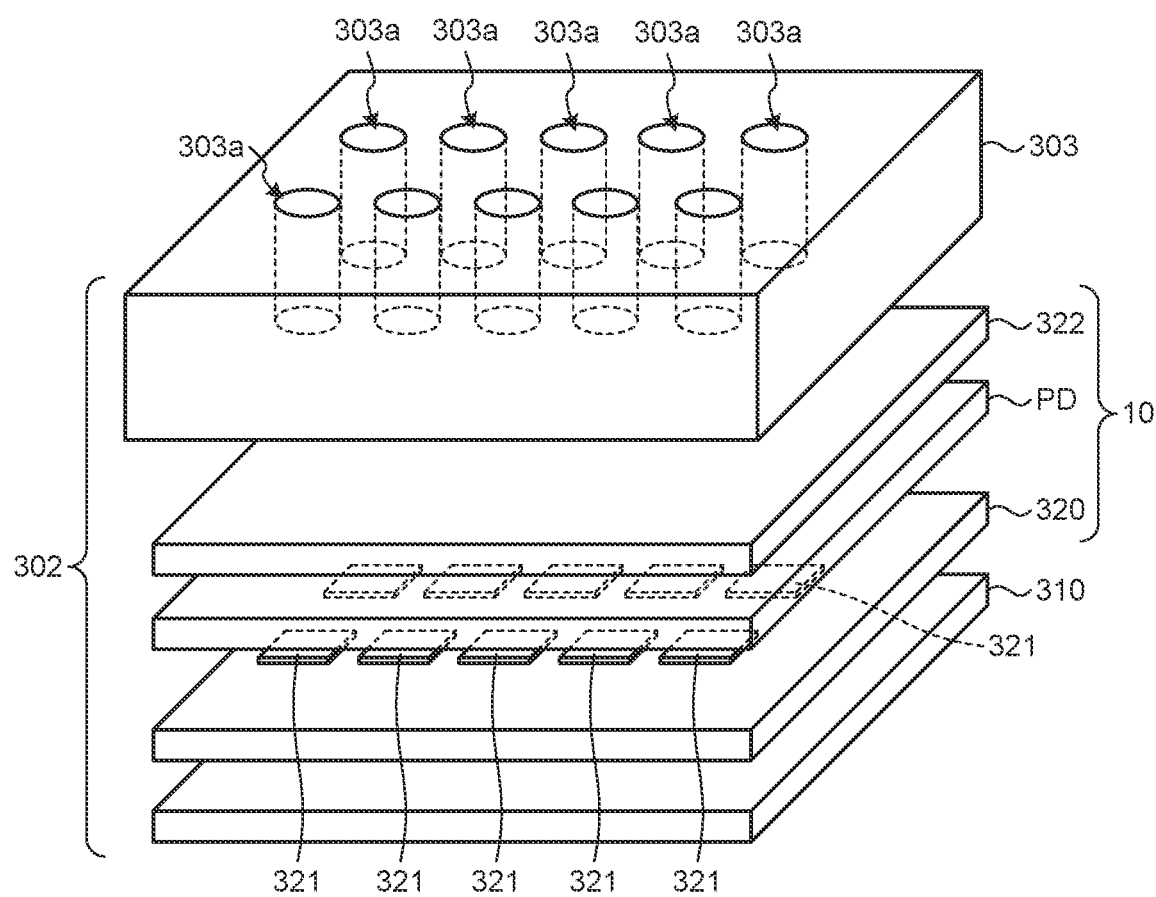
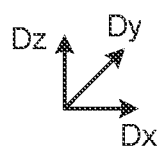

DETECTION DEVICE WITH HEATING ELECTRODE

CROSS-REFERENCE TO RELATED APPLICATION

This application claims the benefit of priority from Japanese Patent Application No. 2021-174996 filed on Oct. 26, 2021, the entire contents of which are incorporated herein by reference.

BACKGROUND

1. Technical Field

The present disclosure relates to a detection device.

2. Description of the Related Art

Detection devices are known that can acquire a planar light-dark pattern visible as, for example, image data by arranging light-receiving elements capable of detecting brightness and darkness of light in a planar configuration (for example, Japanese Patent Application Laid-open Publication No. 2016-164787).

The detection devices exhibit temperature dependence depending on the photoelectric conversion material employed as the light-receiving elements. In general, the output response of the light-receiving elements decreases as the temperature decreases. The output response refers to a degree of change in output in response to a change in degree of sensing of light. However, the conventional detection devices do not take into account how to deal with a case where the temperature of the light-receiving elements is too low.

The present disclosure has been made in view of the problem mentioned above, and it is an object thereof to provide a detection device capable of more easily ensuring the output response.

SUMMARY

A detection device according to an embodiment of the present disclosure includes a photoelectric conversion portion in which a plurality of photodiodes are arranged in a planar shape, a light source configured to irradiate the photodiodes with light, and a heating electrode provided so as to face the photoelectric conversion portion, and configured to generate heat and conduct the heat to the photoelectric conversion portion.

BRIEF DESCRIPTION OF THE DRAWINGS

FIG. 3 is a perspective view illustrating components included in the detection device;

DETAILED DESCRIPTION

Figure 1:
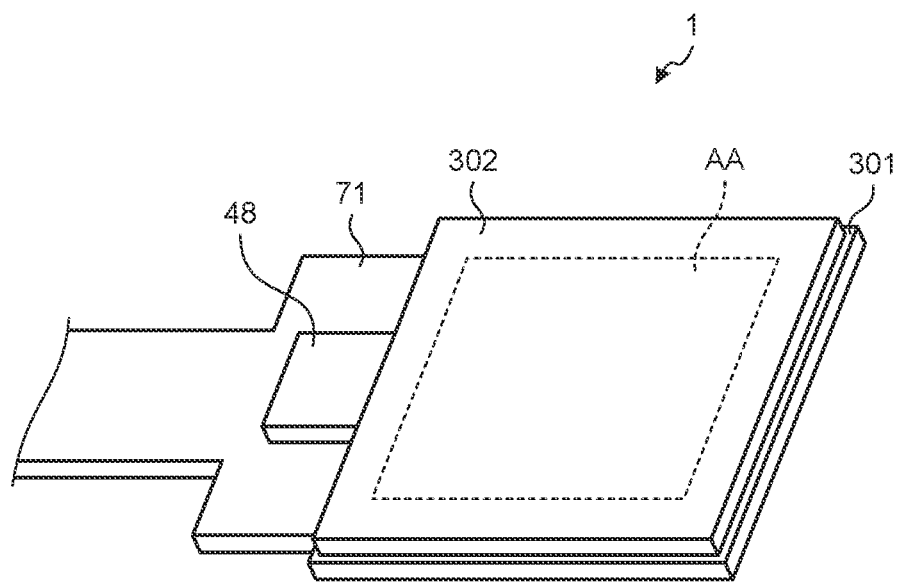
FIG. 1 is a schematic view illustrating a main configuration of a sensor unit.

The following describes embodiments of the present disclosure with reference to the drawings. What is disclosed herein is merely an example, and the present disclosure naturally encompasses appropriate modifications easily conceivable by those skilled in the art while maintaining the gist of the invention. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

FIG. 1 is a schematic view illustrating a main configuration of a sensor unit 1. The sensor unit 1 includes a substrate 301 and a detection device 302. The substrate 301 is a substrate, on one surface side of which the detection device 302 is mounted. Although not illustrated, components such as wiring coupled a sheet heater 310 (to be described later) for operating the sheet heater 310 are mounted on the substrate 301. A photoelectric conversion portion AA, a detection circuit 48, and a flexible printed circuit board 71 illustrated in FIG. 1 will be described later.

Figure 2:
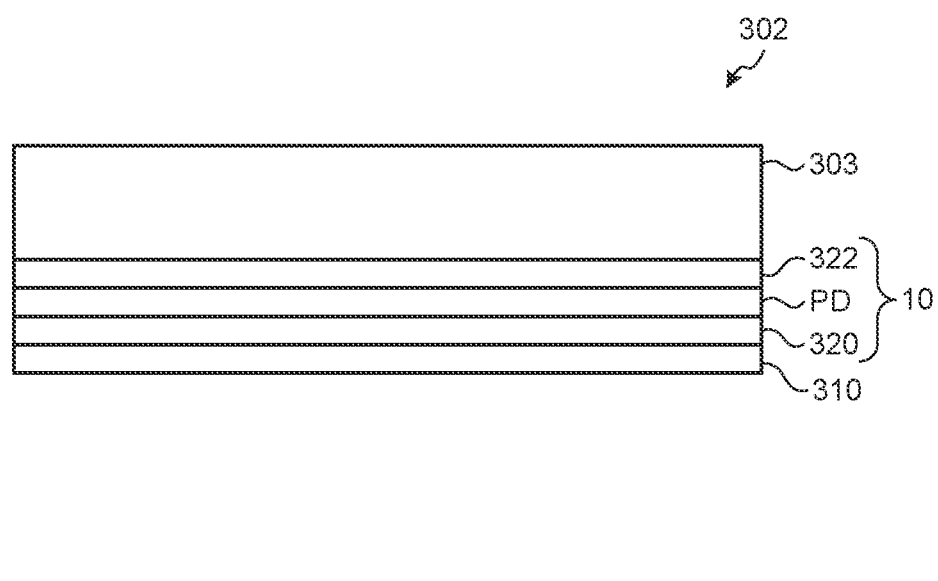
FIG. 2 is a side view illustrating a multilayered structure of a detection device.

FIG. 2 is a side view illustrating a multilayered structure of the detection device 302. FIG. 3 is a perspective view illustrating components included in the detection device 302. The detection device 302 has the multilayered structure in which the sheet heater 310, a sensor portion 10, and a collimator 303 are stacked in this order from one surface side toward the other surface side of the detection device 302. In the following description, the stacking direction in the multilayered structure of the detection device 302 is referred to as a third direction Dz. One of two directions orthogonal to the third direction Dz is referred to as a first direction Dx, and the other of the two directions is referred to as a second direction Dy. The substrate 301 is located on one surface side of the sheet heater 310.

The sheet heater 310 is a film sheet heater provided so as to be capable of heating the sensor portion 10. Specifically, the sheet heater 310 has a sheet-like configuration that includes a heat-generating portion that generates heat due to electrical resistance in response to application of a voltage. The heat-generating portion is made of, for example, indium tin oxide (ITO), molybdenum-chromium (MoCr), silver (Ag), indium zinc oxide (IZO), tungsten (W), molybdenum (Mo), tantalum (Ta), or titanium (Ti), but is not limited to any of these materials, and only needs to be made of a material that is processible into a sheet shape and generates heat in response to the application of a voltage. The sheet heater 310 is provided so as to cover the photoelectric conversion portion AA in a plan view. The planar viewpoint is a viewpoint from which a plane orthogonal to the third direction Dz is viewed face-to-face.

The sensor portion 10 has a multilayered structure in which a circuit board 320, a photodiode PD, and a common electrode 322 are stacked in this order from one surface side toward the other surface side of the sensor portion 10. The configuration of the sensor portion 10 will be described with reference to FIGS. 4 to 11.

Figure 4:
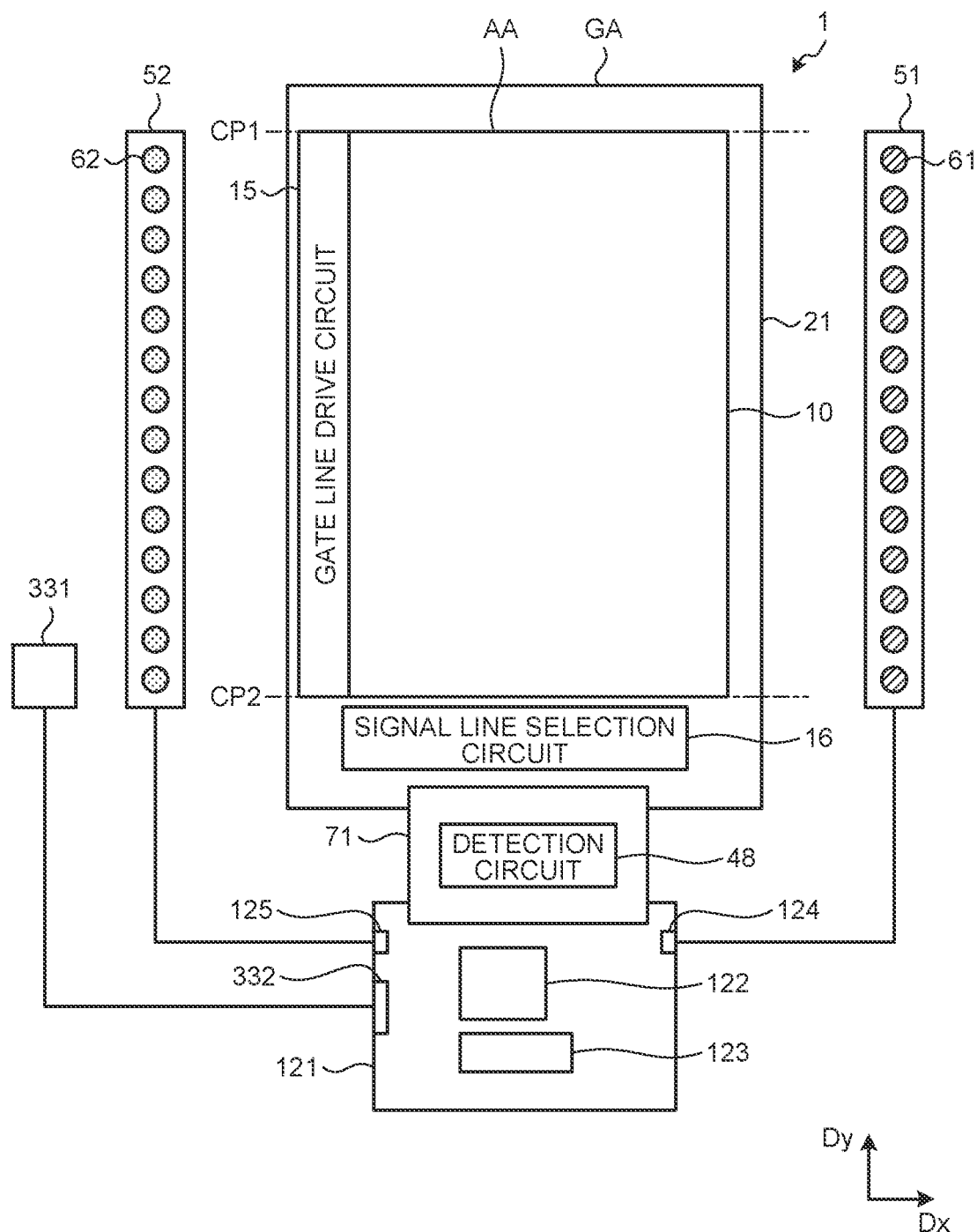
FIG. 4 is a plan view illustrating the sensor unit.

FIG. 4 is a plan view illustrating the sensor unit 1. As illustrated in FIG. 4, the sensor unit 1 includes a sensor substrate 21, a sensor portion 10, a gate line drive circuit 15, a signal line selection circuit 16, the detection circuit 48, a control circuit 122, a power supply circuit 123, a first light source base material 51, a second light source base material 52, first light sources 61, second light sources 62, and a temperature detector 331.

The sensor substrate 21 is electrically coupled to a control substrate 121 through the flexible printed circuit board 71. The flexible printed circuit board 71 is provided with the detection circuit 48. The control substrate 121 is provided with the control circuit 122 and the power supply circuit 123. The control circuit 122 is, for example, a field-programmable gate array (FPGA). The control circuit 122 supplies control signals to the sensor portion 10, the gate line drive circuit 15, and the signal line selection circuit 16 to control a detection operation of the sensor portion 10. The control circuit 122 supplies control signals to the first and the second light sources 61 and 62 to control lighting or non-lighting of the first and the second light sources 61 and 62.

The power supply circuit 123 supplies voltage signals including, for example, a sensor power supply signal VDDSNS (refer to FIG. 7) to the sensor portion 10, the gate line drive circuit 15, and the signal line selection circuit 16. The power supply circuit 123 supplies a power supply voltage to the first and the second light sources 61 and 62.

The sensor substrate 21 has the photoelectric conversion portion AA and a peripheral portion GA. The photoelectric conversion portion AA is an area provided with the photodiodes PD (refer to FIG. 7) included in the sensor portion 10. The peripheral portion GA is an area between the outer perimeter of the photoelectric conversion portion AA and ends of the sensor substrate 21, and is an area not overlapping the photodiodes PD.

A position overlapping one side of the four sides of the photoelectric conversion portion AA that form a boundary between the rectangular photoelectric conversion portion AA and the peripheral portion GA serves as a coupling portion CP1 illustrated in FIG. 2. A position overlapping another of the four sides of the photoelectric conversion portion AA that faces the one side with the photoelectric conversion portion AA interposed therebetween serves as a coupling portion CP2 illustrated in FIG. 2.

The gate line drive circuit 15 and the signal line selection circuit 16 are provided in the peripheral portion GA. Specifically, the gate line drive circuit 15 is provided in an area extending along the second direction Dy in the peripheral portion GA. The signal line selection circuit 16 is provided in an area extending along the first direction Dx in the peripheral portion GA, and is provided between the sensor portion 10 and the detection circuit 48.

The first direction Dx is one direction in a plane parallel to the sensor substrate 21. The second direction Dy is one direction in the plane parallel to the sensor substrate 21, and is a direction orthogonal to the first direction Dx. The second direction Dy may non-orthogonally intersect the first direction Dx. The third direction Dz is a direction orthogonal to the first direction Dx and the second direction Dy, and is a direction normal to the sensor substrate 21

The first light sources 61 are provided on the first light source base material 51, and are arranged along the second direction Dy. The second light sources 62 are provided on the second light source base material 52, and are arranged along the second direction Dy. The first light source base material 51 and the second light source base material 52 are electrically coupled, through terminals 124 and 125, respectively, provided on the control substrate 121, to the control circuit 122 and the power supply circuit 123.

For example, inorganic light-emitting diodes (LEDs) or organic electroluminescent (EL) diodes (organic light-emitting diodes (OLEDs)) are used as the first and the second light sources 61 and 62. The first and the second light sources 61 and 62 emit first and second light, respectively, having different wavelengths. That is, the first light has a first maximum emission wavelength, and the second light has a second maximum emission wavelength different from the first maximum emission wavelength. The term "maximum emission wavelength" refers to a wavelength that exhibits a maximum emission intensity in an emission spectrum representing a relation between the wavelength and the emission intensity of each of the first light and the second light.

As one example, the first light has the first maximum emission wavelength of from 520 nm to 600 nm, for example, approximately 500 nm, and the second light has the second maximum emission wavelength of from 600 nm to 700 nm, for example, approximately 660 nm. That is, the second maximum emission wavelength of the second light is larger than the first maximum emission wavelength of the first light. In this case, the first light and the second light are visible light. The first light is blue light or green light, and the second light is red light.

The first light emitted from the first light sources 61 is reflected on a surface of an object to be detected such as a finger Fg, and is incident on the sensor portion 10. As a result, the sensor portion 10 can detect a fingerprint by detecting a shape of asperities on the surface of the finger Fg or the like. The second light emitted from the second light sources 62 is reflected in the finger Fg or the like, or transmitted through the finger Fg or the like, and is incident on the sensor portion 10. As a result, the sensor portion 10 can detect information on a living body in the finger Fg or the like. Examples of the information on the living body include pulsation of the finger Fg or a palm.

The wavelengths of the first and the second light are not limited to the examples described above, and can be changed as appropriate. For example, the first light may have the first maximum emission wavelength of from 520 nm to 600 nm, for example, approximately 500 nm, and the second light may have the second maximum emission wavelength of from 780 nm to 900 nm, for example, approximately 850 nm. In this case, the first light is blue or green visible light, and the second light is infrared light. The sensor portion 10 can detect the fingerprint based on the first light emitted from the first light sources 61. The second light emitted from the second light sources 62 is reflected in the object to be detected such as the finger Fg, or transmitted through the finger Fg or the like, and is incident on the sensor portion 10. As a result, the sensor portion 10 can detect a vascular image (vein pattern) as the information on the living body in the finger Fg or the like.

Alternatively, the first light may have the first maximum emission wavelength of from 600 nm to 700 nm, for example, approximately 660 nm, and the second light may have the second maximum emission wavelength of from 780 nm to 900 nm, for example, approximately 850 nm. In this case, the sensor portion 10 can detect a blood oxygen level in addition to the pulsation and the vascular image as the information on the living body based on the first light emitted from the first light sources 61 and the second light emitted from the second light sources 62. As described above, the sensor unit 1 includes the first and the second light sources 61 and 62, and therefore, can detect the various types of information on the living body by performing the detection based on the first light and the detection based on the second light.

The arrangement of the first and the second light sources 61 and 62 illustrated in FIG. 4 is merely an example, and may be changed as appropriate. For example, the first and the second light sources 61 and 62 may be arranged on each of the first and the second light source base materials 51 and 52. In this case, a group including the first light sources 61 and a group including the second light sources 62 may be arranged side by side in the second direction Dy, or the first and the second light sources 61 and 62 may be arranged alternately in the second direction Dy. The first and the second light sources 61 and 62 may be provided on one light source base material, or three or more light source base materials.

Figure 5:
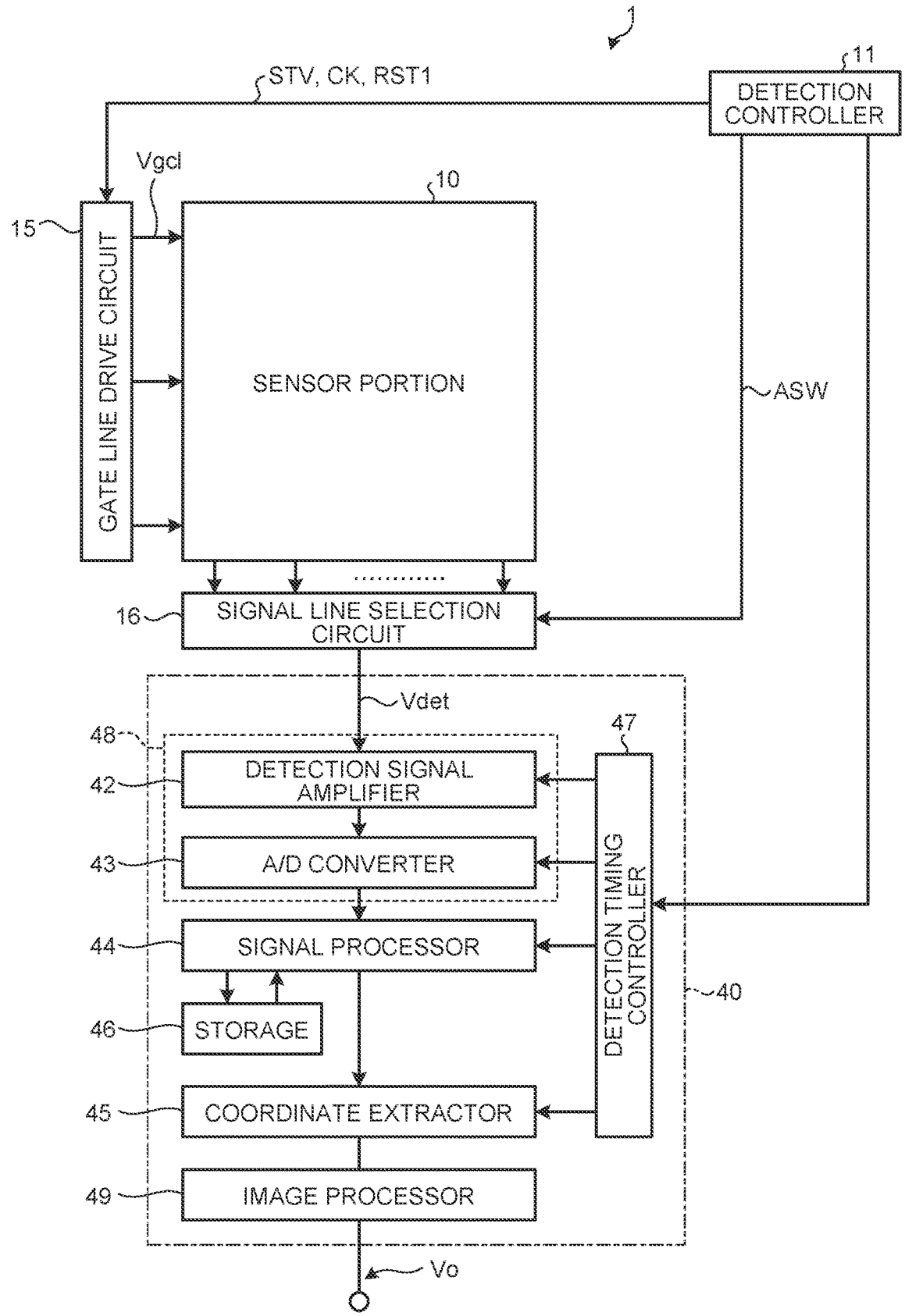
FIG. 5 is a block diagram illustrating a configuration example of the sensor unit.

FIG. 5 is a block diagram illustrating a configuration example of the sensor unit 1. As illustrated in FIG. 5, the sensor unit 1 further includes a detection controller 11 and a detector 40. The control circuit 122 includes one, some, or all of the functions of the detection controller 11. The control circuit 122 also includes one, some, or all of the functions of the detector 40 except those of the detection circuit 48.

The sensor portion 10 is an optical sensor that includes the photodiodes PD serving as photoelectric conversion elements. Each of the photodiodes PD included in the sensor portion 10 outputs an electrical signal corresponding to light irradiating the photodiode PD as a detection signal Vdet to the signal line selection circuit 16. The sensor portion 10 performs the detection in response to a gate drive signal Vgcl supplied from the gate line drive circuit 15.

The detection controller 11 is a circuit that supplies respective control signals to the gate line drive circuit 15, the signal line selection circuit 16, and the detector 40 to control operations thereof. The detection controller 11 supplies various control signals including, for example, a start signal STV, a clock signal CK, and a reset signal RST1 to the gate line drive circuit 15. The detection controller 11 also supplies various control signals including, for example, a selection signal ASW to the signal line selection circuit 16. The detection controller 11 also supplies various control signals to the first and the second light sources 61 and 62 to control the lighting and non-lighting of the respective first and second light sources 61 and 62.

The gate line drive circuit 15 is a circuit that drives a plurality of gate lines GCL (refer to FIG. 6) based on the various control signals. The gate line drive circuit 15 sequentially or simultaneously selects the gate lines GCL, and supplies the gate drive signals Vgcl to the selected gate lines GCL. Through this operation, the gate line drive circuit 15 selects the photodiodes PD coupled to the gate lines GCL.

Figure 6:
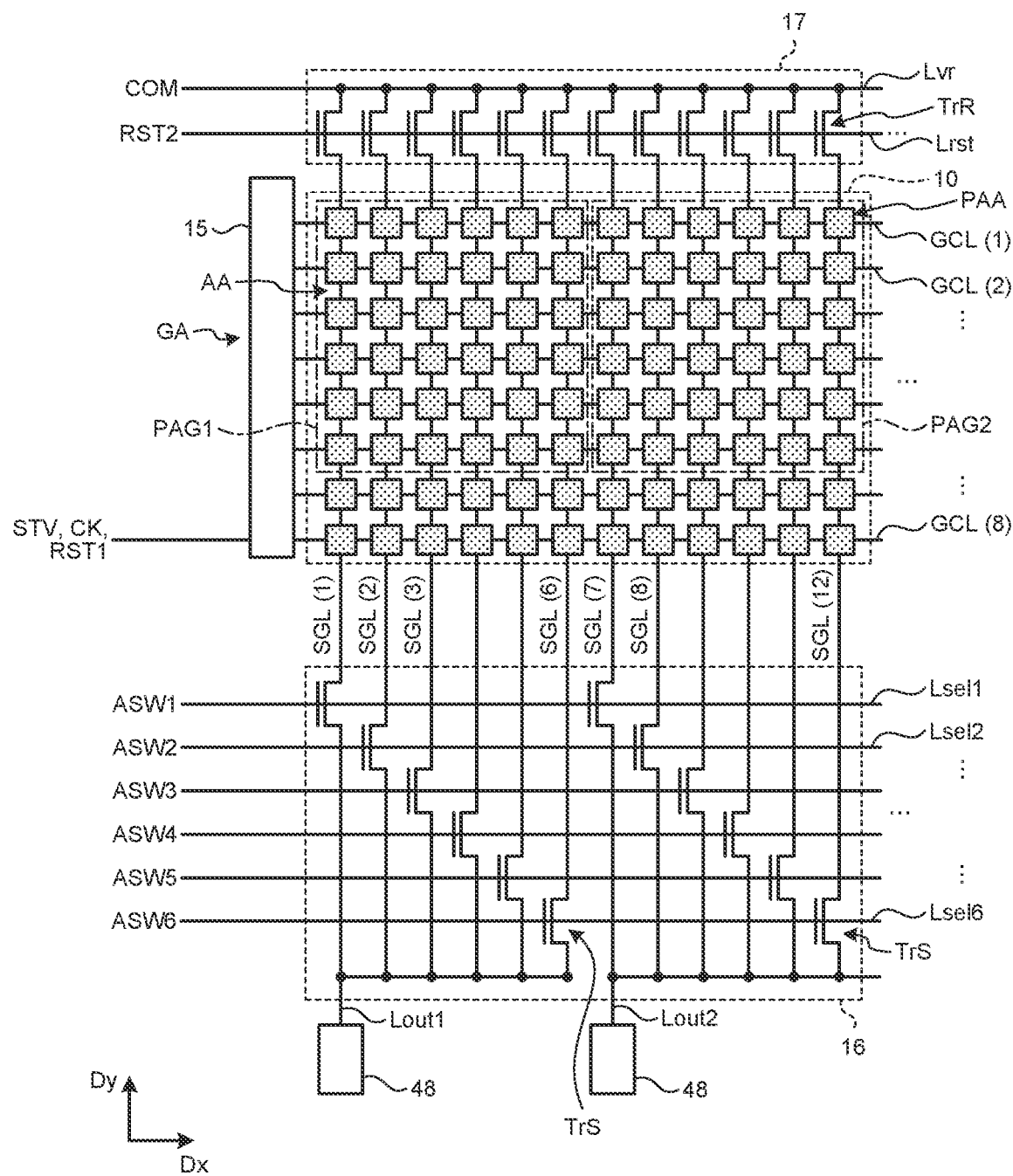
FIG. 6 is a circuit diagram illustrating a sensor portion.

The signal line selection circuit 16 is a switch circuit that sequentially or simultaneously selects a plurality of signal lines SGL (refer to FIG. 6). The signal line selection circuit 16 is, for example, a multiplexer. The signal line selection circuit 16 couples the selected signal lines SGL to the detection circuit 48 based on the selection signal ASW supplied from the detection controller 11. Through this operation, the signal line selection circuit 16 outputs the detection signals Vdet of the photodiodes PD to the detector 40.

The detector 40 includes the detection circuit 48, a signal processor 44, a coordinate extractor 45, a storage 46, a detection timing controller 47, and an image processor 49. Based on a control signal supplied from the detection controller 11, the detection timing controller 47 controls the detection circuit 48, the signal processor 44, the coordinate extractor 45, and the image processor 49 so as to operate in synchronization with one another.

The detection circuit 48 is, for example, an analog front-end (AFE) circuit. The detection circuit 48 is a signal processing circuit having functions of at least a detection signal amplifier (detection signal amplifier circuit) 42 and an analog-to-digital (A/D) converter (A/D converter circuit) 43. The detection signal amplifier 42 amplifies the detection signals Vdet. The A/D converter 43 converts analog signals output from the detection signal amplifier 42 into digital signals.

The signal processor 44 is a logic circuit that detects a predetermined physical quantity received by the sensor portion 10 based on an output signal of the detection circuit 48. The signal processor 44 can detect the asperities on the surface of the finger Fg or the palm based on the signals from the detection circuit 48 when the finger Fg is in contact with or in proximity to a detection surface. The signal processor 44 can also detect the information on the living body based on the signal from the detection circuit 48. Examples of the information on the living body include the vascular image, a pulse wave, the pulsation, and the blood oxygen level of the finger Fg or the palm. The signal processor 44 may also perform processing of acquiring the detection signals Vdet (information on the living body) simultaneously detected by the photodiodes PD, and averaging the detection signals Vdet. In this case, the detector 40 can perform stable detection by reducing measurement errors caused by noise and/or relative positional misalignment between the object to be detected, such as the finger Fg, and the sensor portion 10.

The storage 46 temporarily stores therein a signal calculated by the signal processor 44. The storage 46 may be, for example, a random-access memory (RAM) or a register circuit.

The coordinate extractor 45 is a logic circuit that obtains detected coordinates of the asperities on the surface of the finger or the like when the contact or the proximity of the finger is detected by the signal processor 44. The coordinate extractor 45 is also a logic circuit that obtains detected coordinates of blood vessels of the finger Fg or the palm. The image processor 49 combines the detection signals Vdet output from the respective photodiodes PD of the sensor portion 10 to generate two-dimensional information representing the shape of the asperities on the surface of the finger Fg or the like and two-dimensional information representing the shape of the blood vessels of the finger Fg or the palm. The coordinate extractor 45 may output the detection signals Vdet as sensor outputs Vo instead of calculating the detected coordinates. A case can be considered where the detector 40 does not include the coordinate extractor 45 and the image processor 49.

Figure 7:
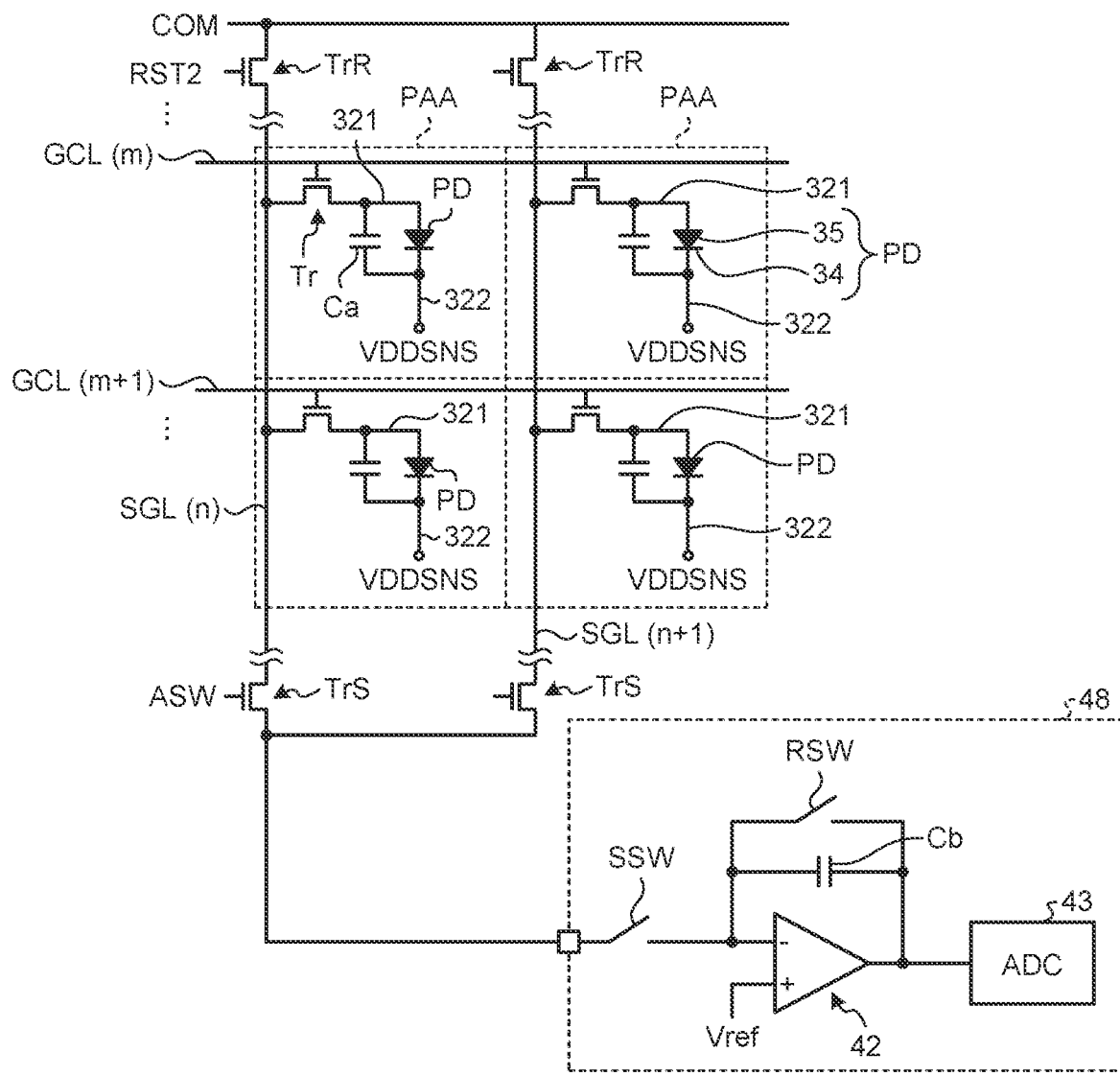
FIG. 7 is a circuit diagram illustrating a plurality of partial detection areas.

The following describes a circuit configuration example of the sensor portion 10. FIG. 6 is a circuit diagram illustrating the sensor portion 10. FIG. 7 is a circuit diagram illustrating a plurality of partial detection areas PAA. FIG. 7 also illustrates a circuit configuration of the detection circuit 48.

As illustrated in FIG. 6, the sensor portion 10 has the partial detection areas PAA arranged in a matrix having a row-column configuration. Each of the partial detection areas PAA is provided with the photodiode PD.

The gate lines GCL extend in the first direction Dx, and are coupled to the partial detection areas PAA arranged in the first direction Dx. A plurality of gate lines GCL(1), GCL(2), . . . , GCL(8) are arranged in the second direction Dy, and are each coupled to the gate line drive circuit 15. In the following description, the gate lines GCL(1), GCL(2), . . . , GCL(8) will each be simply referred to as the gate line GCL when need not be distinguished from one another. For ease of understanding of the description, FIG. 6 illustrates eight of the gate lines GCL. However, this is merely an example, and M (where M is eight or larger, and is, for example, 256) of the gate lines GCL may be arranged.

The signal lines SGL extend in the second direction Dy, and are coupled to the photodiodes PD of the partial detection areas PAA arranged in the second direction Dy. A plurality of signal lines SGL(1), SGL(2), . . . , SGL(12) are arranged in the first direction Dx, and are each coupled to the signal line selection circuit 16 and a reset circuit 17. In the following description, the signal lines SGL(1), SGL(2), . . . , SGL(12) will each be simply referred to as the signal line SGL when need not be distinguished from one another.

For ease of understanding of the description, 12 of the signal lines SGL are illustrated. However, this is merely an example, and N (where N is 12 or larger, and is, for example, 252) of the signal lines SGL may be arranged. In FIG. 6, the sensor portion 10 is provided between the signal line selection circuit 16 and the reset circuit 17. The present disclosure is not limited thereto. The signal line selection circuit 16 and the reset circuit 17 may be coupled to ends of the signal lines SGL in the same direction.

The gate line drive circuit 15 receives the various control signals such as the start signal STV, the clock signal CK, and the reset signal RST1 from the control circuit 122 (refer to FIG. 5). The gate line drive circuit 15 sequentially selects the gate lines GCL(1), GCL(2), . . . , GCL(8) in a time-division manner based on the various control signals. The gate line drive circuit 15 supplies the gate drive signal Vgcl to the selected one of the gate lines GCL. This operation supplies the gate drive signal Vgcl to a plurality of first switching elements Tr coupled to the gate line GCL, and corresponding ones of the partial detection areas PAA arranged in the first direction Dx are selected as detection targets.

The gate line drive circuit 15 may perform different driving for each of detection modes including the detection of the fingerprint and the detection of different items of the information on the living body (such as the pulse wave, the pulsation, the vascular image, and the blood oxygen level). For example, the gate line drive circuit 15 may drive the gate lines GCL in a bundle.

Specifically, the gate line drive circuit 15 simultaneously selects a predetermined number of the gate lines GCL from among the gate lines GCL(1), GCL(2), . . . , GCL(8) based on the control signals. For example, the gate line drive circuit 15 simultaneously selects six of the gate lines GCL(1) to GCL(6), and supplies thereto the gate drive signals Vgcl. The gate line drive circuit 15 supplies the gate drive signals Vgcl through the selected six gate lines GCL to the first switching elements Tr. Through this operation, detection area groups PAG1 and PAG2 each including corresponding ones of the partial detection areas PAA arranged in the first direction Dx and the second direction Dy are selected as the respective detection targets. The gate line drive circuit 15 drives the predetermined number of the gate lines GCL in a bundle, and sequentially supplies the gate drive signals Vgcl to each unit of the predetermined number of the gate lines GCL.

The signal line selection circuit 16 includes a plurality of selection signal lines Lsel, a plurality of output signal lines Lout, and third switching elements TrS. The third switching elements TrS are provided correspondingly to the respective signal lines SGL. Six of the signal lines SGL(1), SGL(2), . . . , SGL(6) are coupled to a common output signal line Lout1. Six of the signal lines SGL(7), SGL(8), . . . , SGL(12) are coupled to a common output signal line Lout2. The output signal lines Lout1 and Lout2 are each coupled to the detection circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks.

Specifically, selection signal lines Lsel1, Lsel2, . . . , Lsel6 are coupled to the third switching elements TrS corresponding to the signal lines SGL(1), SGL(2), . . . , SGL(6), respectively. The selection signal line Lsel1 is coupled to one of the third switching elements TrS corresponding to the signal line SGL(1) and one of the third switching elements TrS corresponding to the signal line SGL(7). The selection signal line Lsel2 is coupled to one of the third switching elements TrS corresponding to the signal line SGL(2) and one of the third switching elements TrS corresponding to the signal line SGL(8).

The control circuit 122 (refer to FIG. 4) sequentially supplies the selection signal ASW to the selection signal lines Lsel. This operation causes the signal line selection circuit 16 to operate the third switching elements TrS to sequentially select the signal lines SGL in one of the signal line blocks in a time-division manner. The signal line selection circuit 16 selects one of the signal lines SGL in each of the signal line blocks. With the above-described configuration, the sensor unit 1 can reduce the number of integrated circuits (ICs) including the detection circuit 48 or the number of terminals of the ICs.

The signal line selection circuit 16 may couple the signal lines SGL in a bundle to the detection circuit 48. Specifically, the control circuit 122 (refer to FIG. 4) simultaneously supplies the selection signal ASW to the selection signal lines Lsel. This operation causes the signal line selection circuit 16 to operate the third switching elements TrS to select the signal lines SGL (for example, six of the signal lines SGL) in one of the signal line blocks, and couple the signal lines SGL to the detection circuit 48. As a result, the signals detected in each of the detection area groups PAG1 and PAG2 are output to the detection circuit 48. In this case, the signals from the partial detection areas PAA (photodiodes PD) included in each of the detection area groups PAG1 and PAG2 are put together and output to the detection circuit 48.

Through the operations of the gate line drive circuit 15 and the signal line selection circuit 16, the detection is performed for each of the detection area groups PAG1 and PAG2. As a result, the intensity of the first detection signal Vdet obtained by a single detection operation increases, so that the sensor sensitivity can be improved. The time required for the detection can also be reduced. As a result, the sensor unit 1 can repeatedly perform the detection in a short time, and thus, can improve a signal-to-noise ratio (S/N), and can also accurately detect a temporal change in the information on the living body, such as the pulse wave.

As illustrated in FIG. 6, the reset circuit 17 includes a reference signal line Lvr, a reset signal line Lrst, and fourth switching elements TrR. The fourth switching elements TrR are provided correspondingly to the signal lines SGL. The reference signal line Lvr is coupled to either the sources or the drains of the fourth switching elements TrR. The reset signal line Lrst is coupled to the gates of the fourth switching elements TrR.

The control circuit 122 supplies a reset signal RST2 to the reset signal line Lrst. This operation turns on the fourth switching elements TrR to electrically couple the signal lines SGL to the reference signal line Lvr. The power supply circuit 123 supplies a reference signal COM to the reference signal line Lvr. This operation supplies the reference signal COM to a capacitive element Ca (refer to FIG. 7) included in each of the partial detection areas PAA.

As illustrated in FIG. 7, each of the partial detection areas PAA includes the photodiode PD, the capacitive element Ca, and a corresponding one of the first switching elements Tr. FIG. 7 illustrates two gate lines GCL(m) and GCL(m+1) arranged in the second direction Dy among the gate lines GCL. FIG. 7 also illustrates two signal lines SGL(n) and SGL(n+1) arranged in the first direction Dx among the signal lines SGL. The partial detection area PAA is an area surrounded by the gate lines GCL and the signal lines SGL. Each of the first switching elements Tr is provided correspondingly to the photodiode PD. The first switching element Tr is constituted by a thin-film transistor, and in this example, constituted by an n-channel metal oxide semiconductor (MOS) thin-film transistor (TFT).

The gates of the first switching elements Tr belonging to the partial detection areas PAA arranged in the first direction Dx are coupled to the gate line GCL. The sources of the first switching elements Tr belonging to the partial detection areas PAA arranged in the second direction Dy are coupled to the signal line SGL. The drain of the first switching element Tr is coupled to the cathode of the photodiode PD and the capacitive element Ca.

The photodiode PD is supplied with the sensor power supply signal VDDSNS from the power supply circuit 123. The signal line SGL and the capacitive element Ca are supplied with the reference signal COM that serves as an initial potential of the signal line SGL and the capacitive element Ca from the power supply circuit 123.

When the partial detection area PAA is irradiated with light, a current corresponding to the amount of the light flows through the photodiode PD. As a result, an electric charge is stored in the capacitive element Ca. After the first switching element Tr is turned on, a current corresponding to the electric charge stored in the capacitive element Ca flows through the signal line SGL. The signal line SGL is coupled to the detection circuit 48 through a corresponding one of the third switching elements TrS of the signal line selection circuit 16. Thus, the sensor portion 10 can detect a signal corresponding to the amount of the light irradiating the photodiode PD in each of the partial detection areas PAA or each of the detection area groups PAG1 and PAG2.

During a reading period Pdet (refer to FIG. 10), a switch SSW of the detection circuit 48 is turned on, and the detection circuit 48 is coupled to the signal lines SGL. The detection signal amplifier 42 of the detection circuit 48 converts a variation of a current supplied from the signal lines SGL into a variation of a voltage, and amplifies the result. A reference voltage Vref having a fixed potential is supplied to a non-inverting input portion (+) of the detection signal amplifier 42, and the signal lines SGL are coupled to an inverting input terminal (−) of the detection signal amplifier 42. In the present embodiment, the same signal as the reference signal COM is supplied as the reference voltage Vref. The detection signal amplifier 42 includes a capacitive element Cb and a reset switch RSW. During a reset period Prst (refer to FIG. 10), the reset switch RSW is turned on, and the electric charge of the capacitive element Cb is reset.

Figure 8:
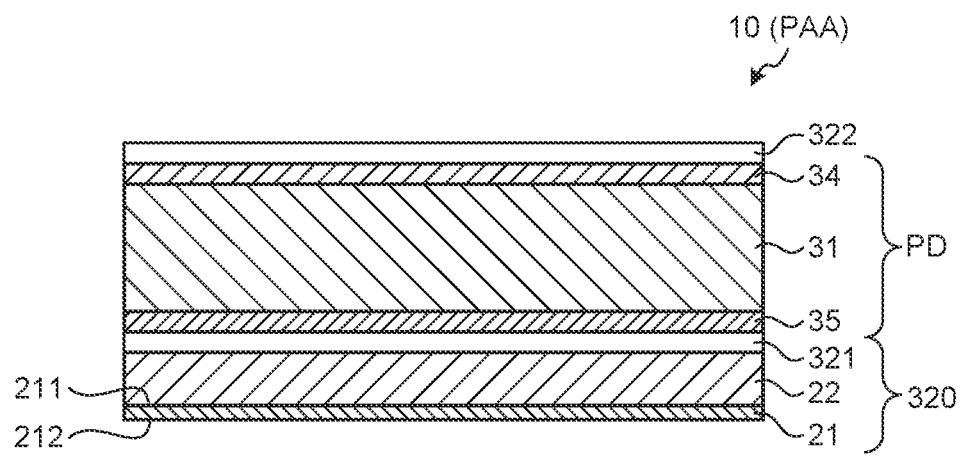
FIG. 8 is a sectional view illustrating a schematic sectional configuration of the sensor portion.
Figure 9:
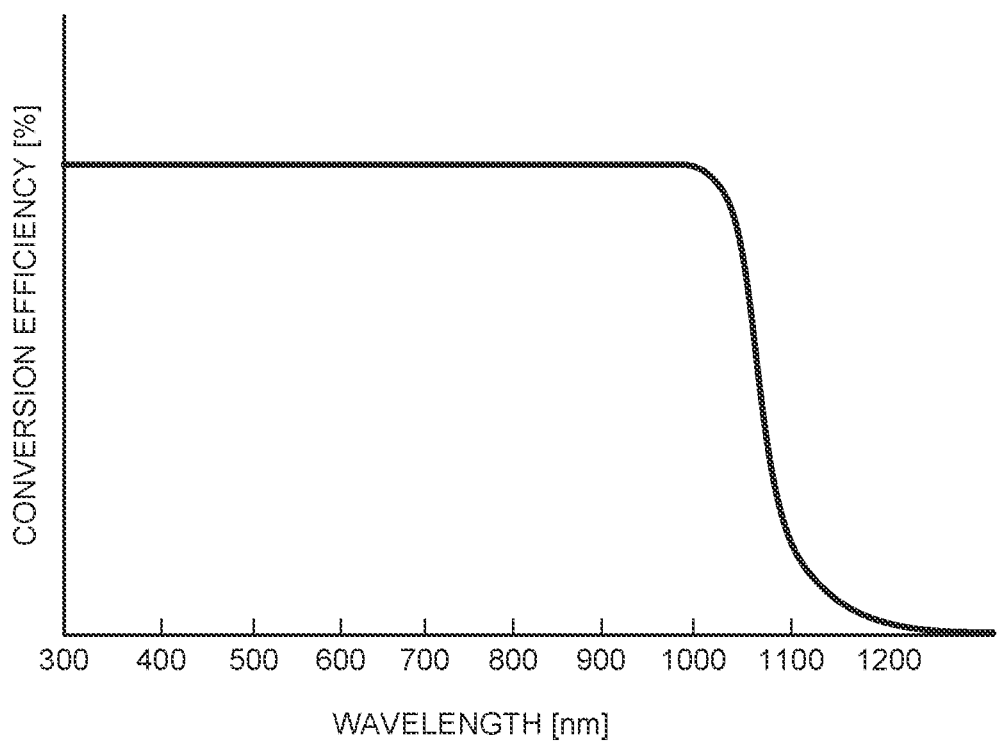
FIG. 9 is a graph schematically illustrating a relation between a wavelength and a conversion efficiency of light incident on a photodiode.

The following describes a configuration of the photodiode PD. FIG. 8 is a sectional view illustrating a schematic sectional configuration of the sensor portion. FIG. 9 is a graph schematically illustrating a relation between the wavelength and a conversion efficiency of light incident on the photodiode.

As illustrated in FIG. 8, the sensor portion 10 includes the sensor substrate 21, a TFT layer 22, an individual electrode 321, the photodiode PD, and the common electrode 322. The sensor substrate 21 is a flexible insulating base material, and is a film-like resin, for example. The sensor substrate 21 has a first surface 211 and a second surface 212 on the opposite side of the first surface 211. The TFT layer 22, the individual electrode 321, the photodiode PD, and the common electrode 322 are stacked in this order on the first surface 211.

The TFT layer 22 is provided with circuits such as the gate line drive circuit 15 and the signal line selection circuit 16 described above. The TFT layer 22 is also provided with TFTs, such as the first switching elements Tr, and various types of wiring such as the gate lines GCL and the signal lines SGL. The sensor substrate 21 and the TFT layer 22 serve as a drive circuit board that drives the sensor for each predetermined detection area, and are also called a backplane.

The individual electrode 321 is coupled to the signal line SGL through the first switching element Tr. The individual electrode 321 is individually provided for each of the partial detection areas PAA. A metal material such as silver (Ag) or aluminum (Al) is used as the individual electrode 321. Alternatively, the individual electrode 321 may be an alloy material containing at least one or more of these metal materials. The individual electrode 321 can be formed as a light-transmitting transflective electrode by controlling the film thickness of the individual electrode 321. For example, the individual electrode 321 is formed of a Ag thin film having a film thickness of 10 nm so as to have light-transmitting property of approximately 60%. In this case, the photodiode PD can detect light emitted from both surface sides of the sensor substrate 21, that is, for example, both the first light emitted from the first surface 211 side and the second light emitted from the second surface 212 side.

The circuit board 320 illustrated in, for example, FIGS. 2 and 3 is a portion of the sensor substrate 21 included in the photoelectric conversion portion AA, and is a portion excluding the other surface side of the individual electrode 321 (photodiode PD and components above the photodiode PD).

Although not illustrated, an insulating layer is provided between the TFT layer 22 and the individual electrode 321. The insulating layer is an inorganic insulating layer. For example, an oxide such as silicon oxide ($SiO_2$) or a nitride such as silicon nitride (SiN) is used as the insulating layer. The insulating layer is provided with a contact hole for coupling the first switching element Tr of the TFT layer 22 to the individual electrode 321.

The photodiode PD is provided above the individual electrode 321. The photodiode PD includes a photoelectric conversion layer 31, a hole transport layer 35, and an electron transport layer 34. The hole transport layer 35, the photoelectric conversion layer 31, and the electron transport layer 34 are stacked in this order in a direction orthogonal to the first surface 211 of the sensor substrate 21. The stacking order in the photodiode PD may be as follows: the electron transport layer 34, the photoelectric conversion layer 31, and the hole transport layer 35.

The photoelectric conversion layer 31 changes in characteristics (for example, voltage-current characteristics and resistance value) according to light emitted thereto. An organic material is used as a material of the photoelectric conversion layer 31. Specifically, as the photoelectric conversion layer 31, low-molecular-weight organic materials can be used including, for example, fullerene ($C_{60}$), phenyl-C61-butyric acid methyl ester (PCBM), copper phthalocyanine (CuPc), fluorinated copper phthalocyanine ($F_{16}$CuPc), 5,6,11,12-tetraphenyltetracene (rubrene), and perylene diimide (PDI) (derivative of perylene).

The photoelectric conversion layer 31 can be formed by a vapor deposition process (dry process) using the above-listed low-molecular-weight organic materials. In this case, the photoelectric conversion layer 31 may be, for example, a multilayered film of CuPc and $F_{16}$CuPc, or a multilayered film of rubrene and $C_{60}$. The photoelectric conversion layer 31 can also be formed by a coating process (wet process). In this case, the photoelectric conversion layer 31 is made using a material obtained by combining the above-listed low-molecular-weight organic materials with high-molecular-weight organic materials. As the high-molecular-weight organic materials, for example, poly(3-hexylthiophene) (P3HT) and F8-alt-benzothiadiazole (F8BT) can be used. The photoelectric conversion layer 31 can be a film in the state of a mixture of P3HT and PCBM or a film in the state of a mixture of F8BT and PDI.

The hole transport layer 35 faces the electron transport layer 34 with the photoelectric conversion layer 31 interposed therebetween. The hole transport layer 35 is provided on the anode side of the photodiode PD. The hole transport layer 35 is formed of a material such as zinc oxide (ZnO), titanium dioxide (TiO2), titanium nitride (TiN), or IGZO (registered trademark), that is, a substance constituted by indium, gallium, zinc, and oxygen. The electron transport layer 34 is provided on the cathode side of the photodiode PD. The electron transport layer 34 is formed of a material such as tungsten trioxide (WO3) or molybdenum trioxide.

The common electrode 322 is a thin film-like electrode provided so as to cover the photoelectric conversion portion AA when viewed from a planar viewpoint. For example, a light-transmitting conductive material such as ITO is used as the common electrode 322.

Although not illustrated, a protective film may be provided between the common electrode 322 and the collimator 303. The protective film is, for example, a passivation film, and is provided to protect the photodiode PD located in a position facing the protective film with the common electrode 322 interposed therebetween.

FIG. 9 is the graph schematically illustrating the relation between the wavelength and the efficiency of the light incident on the photodiode. The horizontal axis of the graph illustrated in FIG. 9 represents the wavelength of the light incident on the photodiode PD, and the vertical axis of the graph represents an external quantum efficiency of the photodiode PD. The external quantum efficiency is expressed, for example, as a ratio between the number of photons of the light incident on the photodiode PD and a current that flows from the photodiode PD to the external detection circuit 48.

As illustrated in FIG. 9, the photodiode PD has a good efficiency in a wavelength band of from approximately 300 nm to approximately 1000 nm. That is, the photodiode PD is sensitive to wavelengths of both the first light emitted from the first light sources 61 and the second light emitted from the second light sources 62. Therefore, each of the photodiodes PD can detect a plurality of rays of light having different wavelengths.

Figure 10:
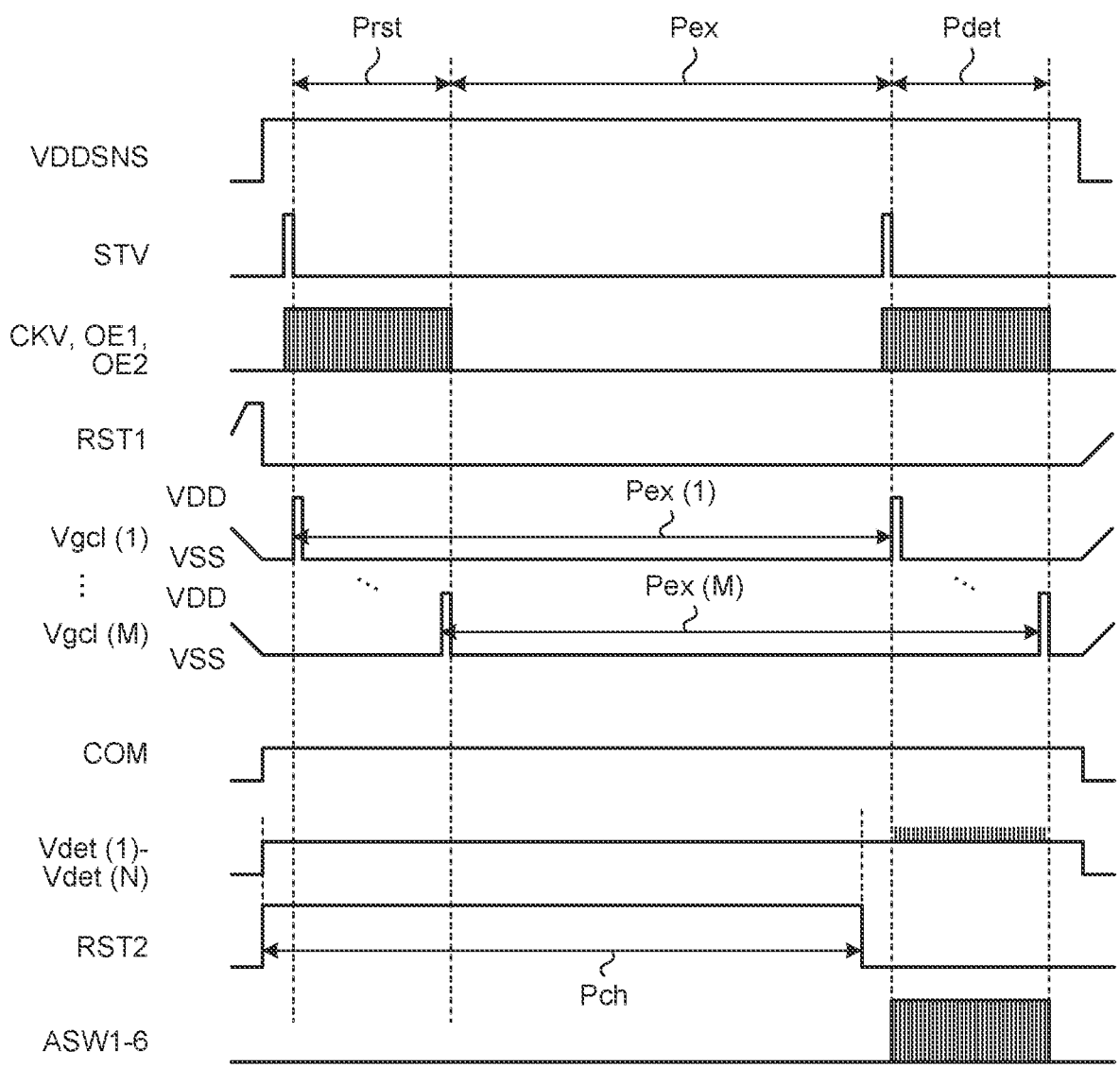
FIG. 10 is a timing waveform diagram illustrating an operation example of the sensor portion.
Figure 11:
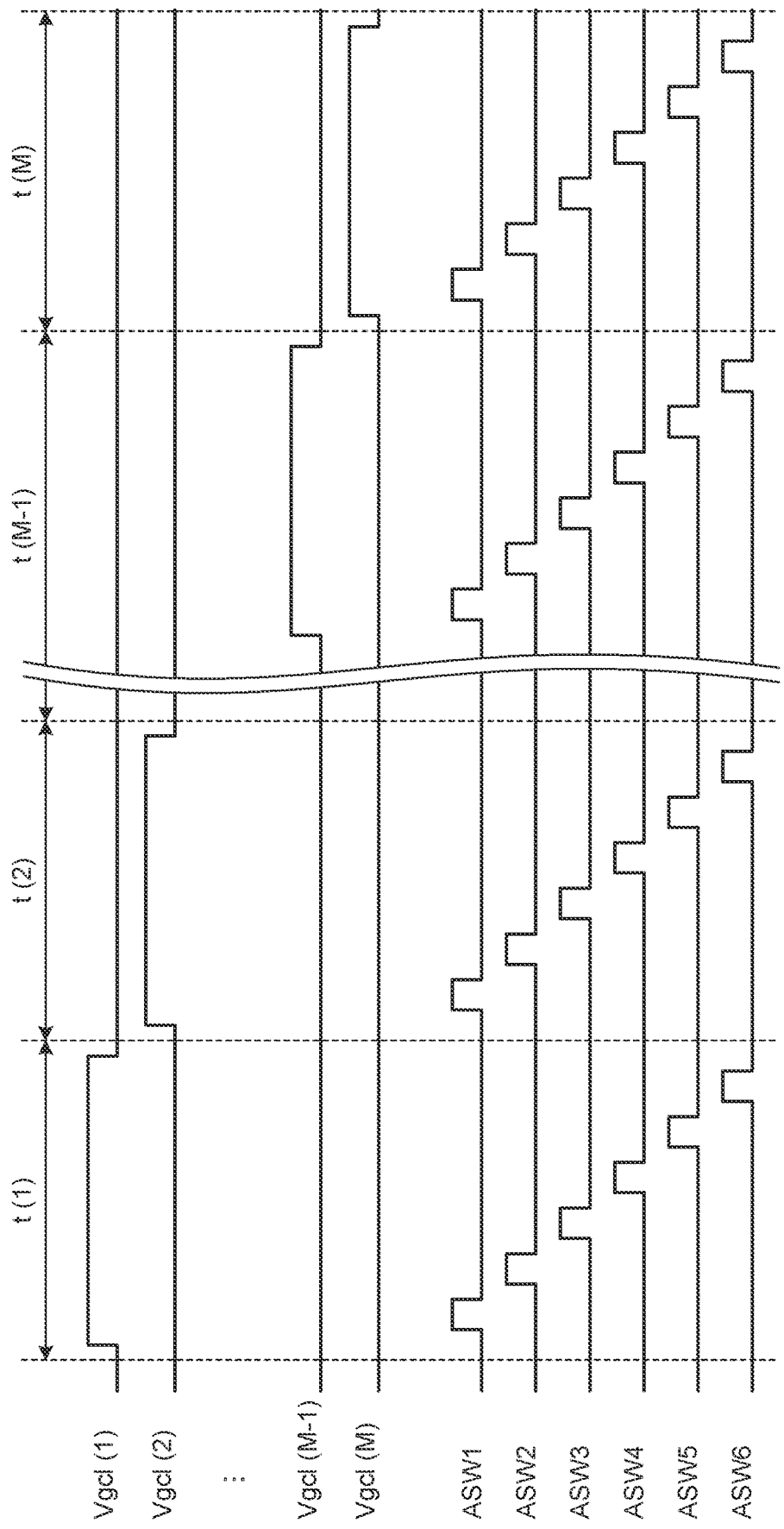
FIG. 11 is a timing waveform diagram illustrating an operation example during a reading period in FIG. 10.

The following describes an operation example of the sensor portion 10. FIG. 10 is a timing waveform diagram illustrating the operation example of the sensor portion 10. FIG. 11 is a timing waveform diagram illustrating an operation example during the reading period in FIG. 10.

As illustrated in FIG. 10, the sensor portion 10 includes the reset period Prst, an exposure period Pex, and the reading period Pdet. The power supply circuit 123 supplies the sensor power supply signal VDDSNS to the photodiode PD over the reset period Prst, the exposure period Pex, and the reading period Pdet. At a time before the reset period Prst starts, the control circuit 122 supplies the reference signal COM and the reset signal RST2 serving as a high-level voltage signal to the reset circuit 17. At this time, the reference signal COM is at 0.75 V. The control circuit 122 supplies the start signal STV to the gate line drive circuit 15 to start the reset period Prst.

During the reset period Prst, the gate line drive circuit 15 sequentially selects the gate lines GCL based on the start signal STV, the clock signal CK, and the reset signal RST1.

The gate line drive circuit 15 sequentially supplies the gate drive signal Vgcl to the gate lines GCL. The gate drive signal Vgcl has a pulsed waveform having a power supply voltage VDD serving as a high-level voltage and a power supply voltage VSS serving as a low-level voltage. In FIG. 10, M (where M is, for example, 256) of the gate lines GCL are provided, and the gate drive signals Vgcl(1), . . . , Vgcl(M) are sequentially supplied to the respective gate lines GCL.

Thus, during the reset period Prst, the capacitive elements Ca of all the partial detection areas PAA are sequentially electrically coupled to the signal lines SGL, and are supplied with the reference signal COM. As a result, the capacities of the capacitive elements Ca are reset.

After the gate drive signal Vgcl(M) is supplied to the gate line GCL, the exposure period Pex starts. The start timing and the end timing of the actual exposure periods Pex(1), . . . , Pex(M) are different among the partial detection areas PAA corresponding to the respective gate lines GCL. Each of the exposure periods Pex(1), . . . , Pex(M) starts when the gate drive signal Vgcl changes from the power supply voltage VDD serving as the high-level voltage to the power supply voltage VSS serving as the low-level voltage during the reset period Prst. Each of the exposure periods Pex(1), . . . , Pex(M) ends when the gate drive signal Vgcl changes from the power supply voltage VSS to the power supply voltage VDD during the reading period Pdet. The lengths of exposure time of the exposure periods Pex(1), . . . , Pex(M) are equal.

During the exposure period Pex, the current corresponding to the light irradiating the photodiode PD flows in each of the partial detection areas PAA. As a result, an electric charge is stored in each of the capacitive elements Ca.

At a time before the reading period Pdet starts, the control circuit 122 sets the reset signal RST2 to a low-level voltage. This operation stops operation of the reset circuit 17. During the reading period Pdet, the gate line drive circuit 15 sequentially supplies the gate drive signals Vgcl(1), . . . , Vgcl(M) to the gate lines GCL in the same manner as during the reset period Prst.

Specifically, as illustrated in FIG. 11, the gate line drive circuit 15 supplies the gate drive signal Vgcl(1) at the high-level voltage (power supply voltage VDD) to the gate line GCL(1) during a period t(1). The control circuit 122 sequentially supplies selection signals ASW1, . . . , ASW6 to the signal line selection circuit 16 during a period in which the gate drive signal Vgcl(1) is at the high-level voltage (power supply voltage VDD). This operation sequentially or simultaneously couples the signal lines SGL of the partial detection areas PAA selected by the gate drive signal Vgcl(1) to the detection circuit 48. As a result, the detection signal Vdet for each of the partial detection areas PAA is supplied to the detection circuit 48.

In the same manner, the gate line drive circuit 15 supplies the gate drive signals Vgcl(2), . . . , Vgcl(M−1), Vgcl(M) at the high-level voltage to gate lines GCL(2), . . . , GCL(M−1), GCL(M) during periods t(2), . . . , t(M−1), t(M), respectively. That is, the gate line drive circuit 15 supplies the gate drive signal Vgcl to the gate line GCL during each of the periods t(1), t(2), . . . , t(M−1), t(M). The signal line selection circuit 16 sequentially selects the signal lines SGL based on the selection signal ASW during each period in which the gate drive signal Vgcl is set to the high-level voltage. The signal line selection circuit 16 sequentially couples each of the signal lines SGL to one detection circuit 48. Thus, the sensor portion 10 can output the detection signals Vdet of all the partial detection areas PAA to the detection circuit 48 during the reading period Pdet.

Although FIG. 11 illustrates the example in which the gate line drive circuit 15 selects one of the gate lines GCL in each of the periods t, the present disclosure is not limited to this example. The gate line drive circuit 15 may simultaneously select a predetermined number (two or more) of the gate lines GCL, and sequentially supply the gate drive signals Vgcl to each unit of the predetermined number of the gate lines GCL. The signal line selection circuit 16 may also simultaneously couple a predetermined number (two or more) of the signal lines SGL to the one detection circuit 48. Moreover, the gate line drive circuit 15 may thin out some of the gate lines GCL and scan the remaining ones.

The above description with reference to FIG. 10 has been made on the assumption that the gate drive signals Vgcl(1), Vgcl(2), . . . , Vgcl(M−1), Vgcl(M) are supplied to the gate lines GCL(1), GCL(2), . . . , GCL(M−1), GCL(M). However, the operation of the sensor portion 10 in the embodiment is not limited to this description. For example, an operation mode may be employed that includes a plurality of sequences, each supplying the gate drive signals to some of these gate lines.

The temperature detector 331 detects the temperature of the photoelectric conversion portion AA. The temperature detector 331, for example, a thermistor or a resistance thermometer, is provided so as to be capable of detecting the temperature based on a relation between the temperature and the electrical resistance. As illustrated in FIG. 4, the temperature detector 331 is electrically coupled to the control circuit 122 and the power supply circuit 123 through a terminal 332 provided on the control substrate 121. In FIG. 4, the temperature detector 331 is separate from the sensor substrate 21, but in reality, the temperature detector 331 is in contact with the sensor substrate 21. Specifically, the temperature detector 331 is in contact with the sensor substrate 21 in a position not preventing light from reaching the both surfaces of the photoelectric conversion portion AA and in a position as close as possible to the photoelectric conversion portion AA.

Figure 12:
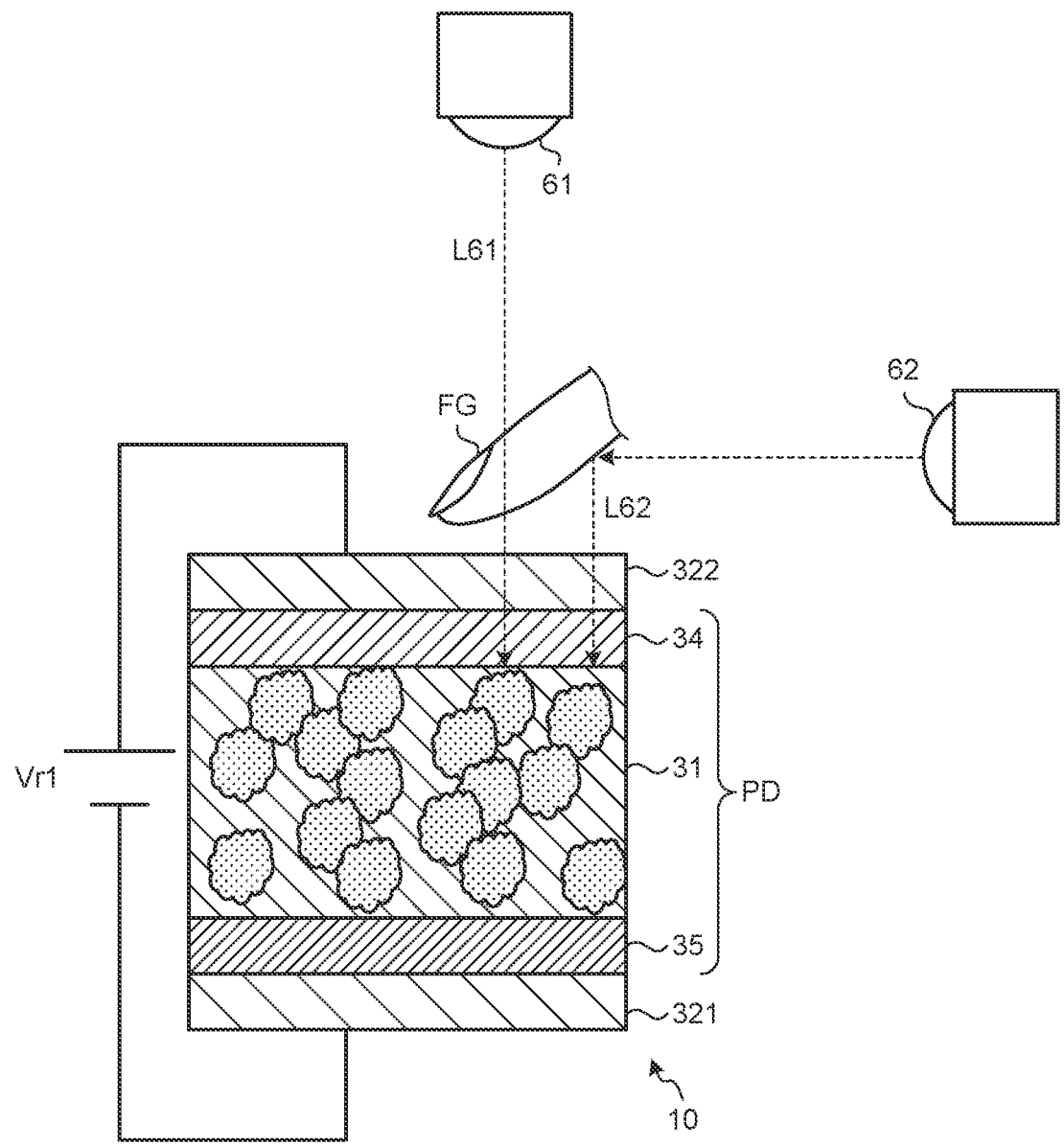
FIG. 12 is a schematic view illustrating a mechanism of detection by the sensor portion according to an embodiment.

FIG. 12 is a schematic view illustrating a mechanism of the detection by the sensor portion 10 of the embodiment. In the sensor portion 10 of the embodiment, the light of at least either of the first light sources 61 and the second light sources 62 coming from the common electrode 322 side is detected by the photodiode PD. Specifically, when the detection target such as the finger Fg that affects the light is located near the photodiode PD, the detection target varies the degree that light L61 from the first light sources 61 arrives at the photodiode PD. When the detection target is located near the photodiode PD, light L62 from the second light sources 62 is reflected by the detection target and enters the photodiode PD. Therefore, the detection target varies the degree that light L62 from the second light sources 62 arrives at the photodiode PD. Thus, by using the photodiode PD to detect the degree of arrival of light that is varied by the relation with the detection target, the sensor portion 10 can acquire information on the detection target as a light-dark pattern of light.

Although not illustrated in FIG. 12, the light L61 and the light L62 pass through light guide holes 303a provided in the collimator 303 illustrated in FIG. 3, and reach the photodiode PD from the common electrode 322 side. The collimator 303 is a member that blocks light. The light guide holes 303a are insertion holes provided in the collimator 303. By limiting the light (such as the light L61 and the light L62) reaching the photodiode PD to the light that has passed through the light guide holes 303a, the light to be detected by the photodiode PD can be limited to light along the third direction Dz or light having almost no intersection angle with respect to the third direction Dz even if the light has traveled in a direction intersecting the third direction Dz. As the intersection angle of the light with respect to the third direction Dz increases, the light is more blocked by sidewalls of the light guide holes 303a even if the light has entered the light guide holes 303a. When viewed from a planar viewpoint, the arrangement of the light guide holes 303a overlaps the arrangement of the individual electrodes 321.

The photodiode PD is given a voltage Vr1 by the sensor power supply signal VDDSNS described above to the individual electrode 321. The voltage Vr1 acts as a reverse bias to the photodiode PD. Specifically, the voltage Vr1 causes a relatively high voltage to be applied to the common electrode 322, and causes a relatively low voltage to be applied to the individual electrode 321. The individual electrode 321 is coupled to the anode of the photodiode PD. The common electrode 322 is coupled to the cathode of the photodiode PD. The photodiode PD is provided with the hole transport layer 35 on the anode side and the electron transport layer 34 on the cathode side with the photoelectric conversion layer 31 interposed therebetween. Accordingly, the individual electrode 321 contacts the hole transport layer 35, and the common electrode 322 contacts the electron transport layer 34. The voltage Vr1 is, for example, 2 volts (V), but is not limited thereto, and can be changed as appropriate according to various conditions such as a material employed in the photodiode PD. The voltage Vr1 is supplied from the power supply circuit 123.

When the organic materials are employed in the photoelectric conversion layer 31 as described above, the photodiode PD exhibits temperature dependence where the sensitivity changes with temperature. The temperature dependence will be described below with reference to FIG. 13.

Figure 13:
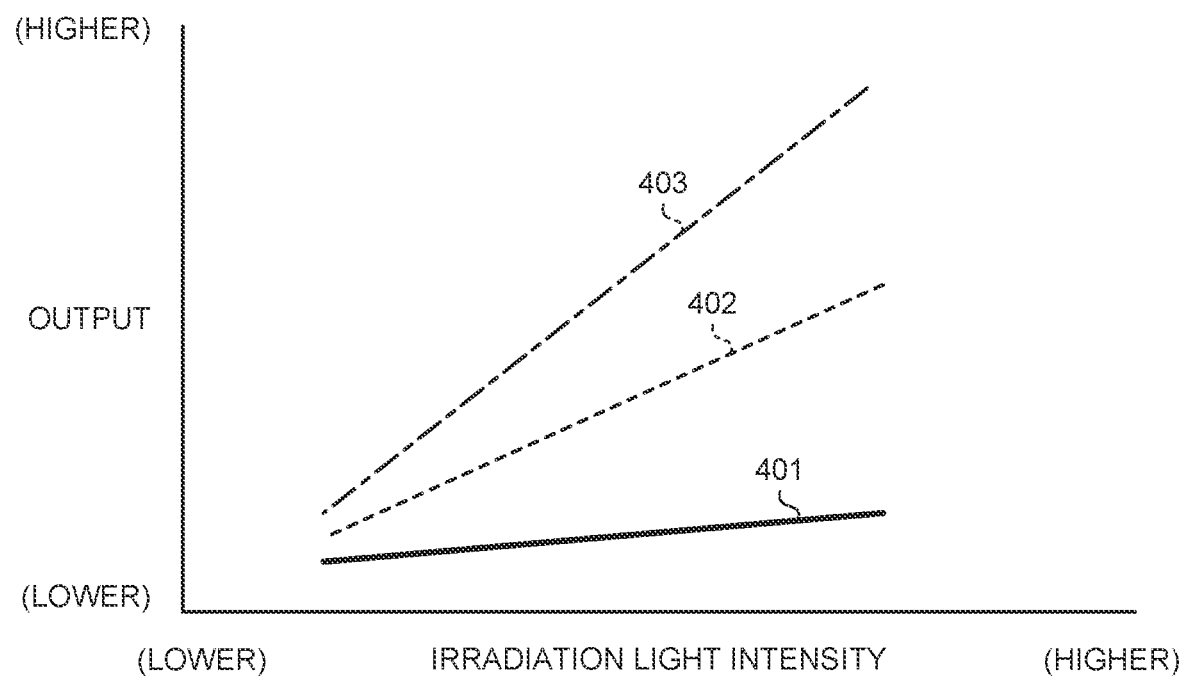
FIG. 13 depicts graphs illustrating relations of an intensity of light irradiating three of the photodiodes different in temperature with levels of outputs by the three photodiodes.

FIG. 13 depicts graphs illustrating relations of an intensity of light irradiating three of the photodiodes PD different in temperature with levels of outputs by the three photodiodes PD. A graph 401 depicted in FIG. 13 is a graph illustrating a relation of the intensity of the light irradiating the photodiode PD at the lowest temperature among the three photodiodes PD at temperatures different from one another with the levels of the outputs by the three photodiodes PD. A graph 403 is a graph illustrating a relation of the intensity of the light irradiating the photodiode PD at the highest temperature among the three photodiodes PD at temperatures different from one another with the levels of the outputs by the three photodiodes PD. A graph 402 is a graph illustrating a relation of the intensity of the light irradiating the photodiode PD at an intermediate temperature among the three photodiodes PD at temperatures different from one another with the levels of the outputs by the three photodiodes PD.

As illustrated in FIG. 13, the photodiode PD exhibits the temperature dependence where decrease in temperature lowers the response of the output corresponding to the intensity of the light irradiating the photodiode PD. Therefore, excessively low temperature of the photodiode PD may make it difficult to well identify the presence or absence of the detection target such as the finger Fg illustrated in FIG. 12.

If, for example, the temperature exceeds 25° C., the organic materials employed in the photodiode PD of the embodiment can obtain the output response that enables sufficient identification of the intensity of the light irradiating the photodiode PD, as indicated by the graphs 402 and 403 illustrated in FIG. 13. Therefore, in the embodiment, the temperature detector 331 detects the temperature of the sensor substrate 21 provided with the photodiodes PD included in the photoelectric conversion portion AA, and sensing is performed if the temperature of the sensor substrate 21 exceeds 25° C. The term "sensing" refers to the acquisition of the light-dark pattern in the photoelectric conversion portion AA obtained by the operation of the photodiodes PD described with reference to FIGS. 10 and 11. That is, the first and the second light sources 61 and 62 are turned on during the sensing. In other words, the first and the second light sources 61 and 62 are not turned on except during the sensing. In the embodiment, the temperature of the sensor substrate 21 detected by the temperature detector 331 is regarded as the temperature of the photoelectric conversion portion AA and the photodiodes PD included in the photoelectric conversion portion AA.

In the embodiment, in order to more reliably ensure the operating environment of the photodiodes PD at 25° C. or higher, the photodiodes PD are heated by the operation of the sheet heater 310 under a predetermined temperature condition. Hereafter, the simple term "temperature condition" refers to the predetermined temperature condition. The temperature condition means, for example, that the temperature of the photodiodes PD is lower than 30° C. A state in which the temperature of the photodiodes PD exceeds 25° C. can be more reliably achieved by operating the sheet heater 310 from when the temperature is detected to be lower than 30° C.

Furthermore, in the embodiment, the sensing is also kept from being performed when the temperature of the photodiodes PD is too high. In the embodiment, the operations of the sheet heater 310 and the photodiodes PD are controlled by combining the temperature condition for operating the sheet heater 310 described above and a temperature range for performing the sensing determined based on the temperature condition.

Specifically, the temperature at which the sheet heater 310 is operated, as defined by the temperature condition, is Ts° C. Ts° is, for example, 30° C. mentioned above. The temperature range is ±td° centered at Ts°. td is 5, for example. Accordingly, in the embodiment, the temperature range is set such that Ts°−td°=25° C.

Figure 14:
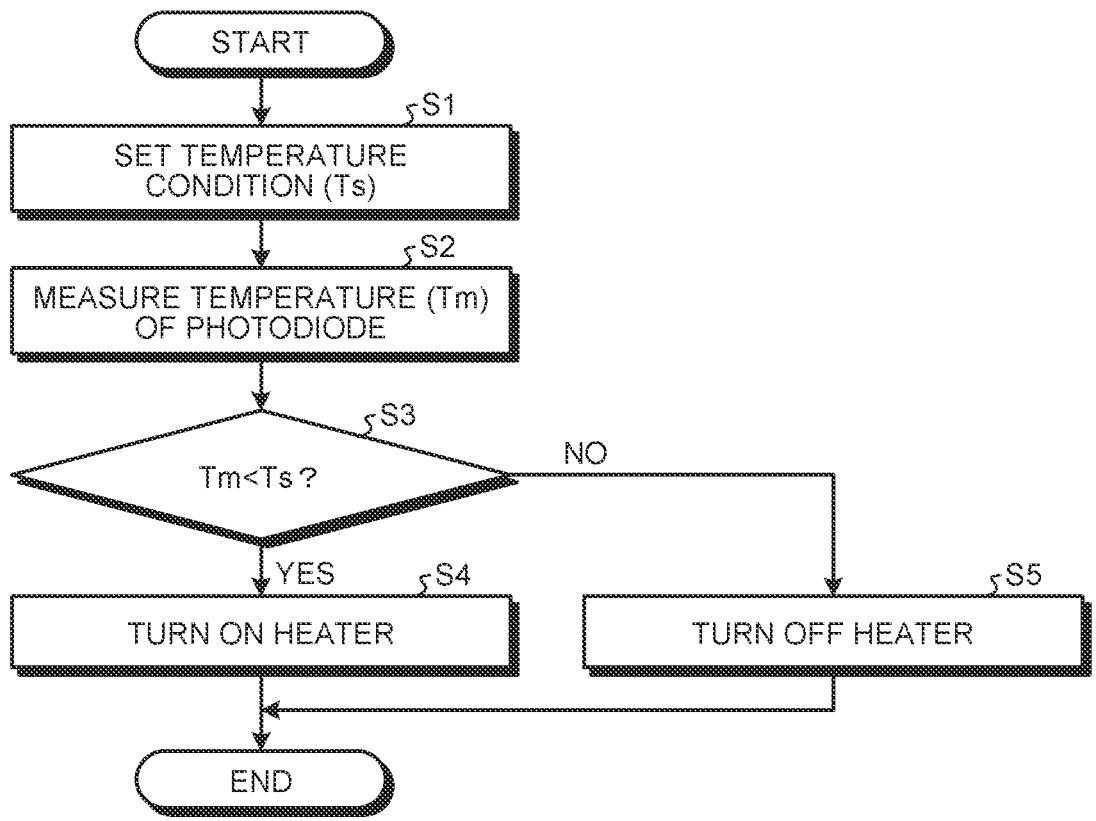
FIG. 14 is a flowchart illustrating a flow of processing related to an operation of a sheet heater.

FIG. 14 is a flowchart illustrating a flow of processing related to the operation of the sheet heater 310. First, the control circuit 122 sets the temperature condition (Step S1). Specifically, the control circuit 122 reads data indicating Ts° described above that is held in the control circuit 122 or in an external storage circuit (not illustrated) readable from the control circuit 122.

Then, the control circuit 122 measures the temperature of the photodiodes PD (Step S2). Specifically, the control circuit 122 measures the temperature of the sensor substrate 21 provided with the photoelectric conversion portion AA based on an output of the temperature detector 331. In other words, the control circuit 122 measures the temperature regarded as the temperature of the photodiodes PD in the embodiment. The control circuit 122 sets the temperature of the photodiodes PD obtained by the processing at Step S2 as Tm° C.

The control circuit 122 determines whether an inequality Tm<Ts holds (Step S3). If the inequality Tm<Ts holds (Yes at Step S3), the control circuit 122 operates the sheet heater 310 (Step S4). If the inequality Tm<Ts does not hold (No at Step S3), the control circuit 122 does not operate the sheet heater 310 (Step S5).

Figure 15:
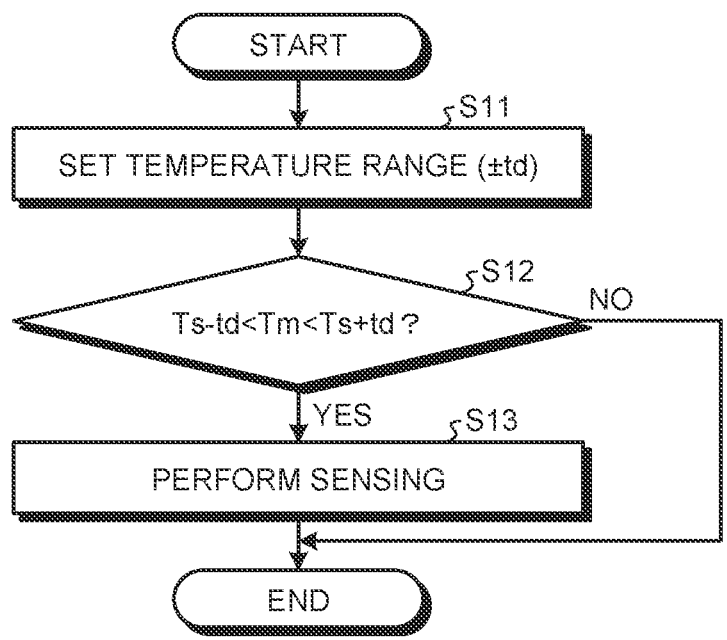
FIG. 15 is a flowchart illustrating a flow of determination related to control of sensing.

FIG. 15 is a flowchart illustrating a flow of determination related to control of the sensing. In the determination regarding the control of the sensing, it is assumed that the processing related to the operation of the sheet heater 310 described with reference to FIG. 14 has already been performed. After the processing related to the operation of the sheet heater 310 is performed, a determination is made regarding the control of the sensing to be described with reference to FIG. 15. The determination is made within an elapsed time in which the validity of the temperature of the photodiodes PD obtained by the processing at Step S2 included in the processing related to the operation of the sheet heater 310 is not lost.

First, the control circuit 122 sets the temperature range (Step S11). Specifically, the control circuit 122 reads data indicating td described above that is held in the control circuit 122 or in the external storage circuit (not illustrated) readable from the control circuit 122.

The control circuit 122 determines whether an inequality Ts−td<Tm<Ts+Td holds (Step S12). Ts in the processing at Step S12 is Ts of the temperature condition (Ts° C.) set by the processing at Step S1 illustrated in FIG. 14. Tm in the processing at Step S12 is Tm of the temperature (Tm° C.) of the photodiodes PD obtained by the processing at Step S2 illustrated in FIG. 14. If the inequality Ts−td<Tm<Ts+Td holds (Yes at Step S12), the sensing is performed (Step S13). If the inequality Ts−td<Tm<Ts+Td does not hold (No at Step S12), the processing at Step S13 is not performed. That is, if the inequality Ts−td<Tm<Ts+Td does not hold, the sensing is not performed.

The embodiment of the detection device according to the present disclosure is not limited to the mode described with reference to FIGS. 1 to 15. The following describes other embodiments of the present disclosure.

Second Embodiment

Figure 16:
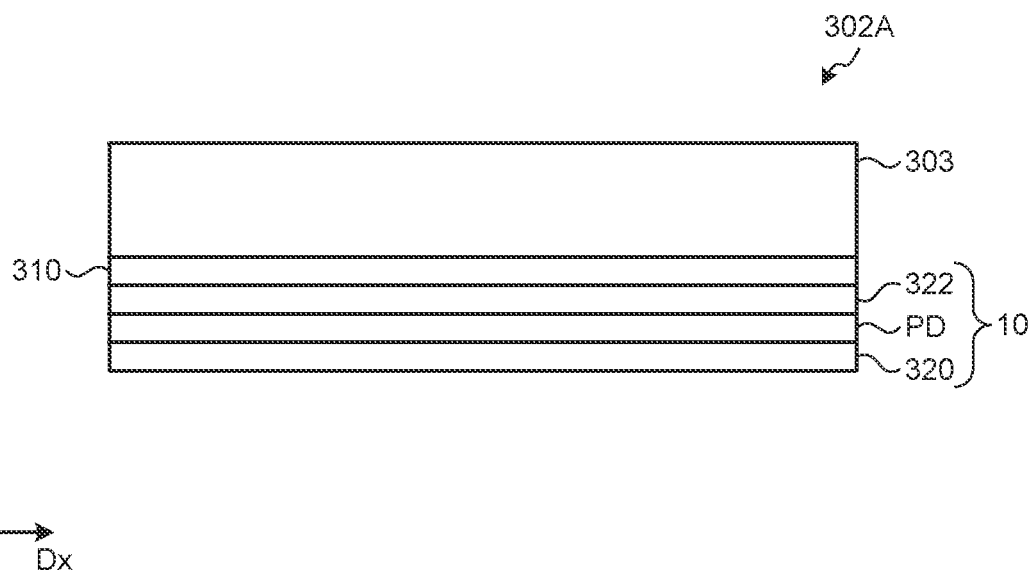
FIG. 16 is a side view illustrating a multilayered structure of a detection device according to a second embodiment.

FIG. 16 is a side view illustrating a multilayered structure of a detection device 302A according to a second embodiment. Unlike the detection device 302 described with reference to FIG. 2, the detection device 302A has the multilayered structure in which the sensor portion 10, the sheet heater 310, and the collimator 303 are stacked in this order from one surface side toward the other surface side of the detection device 302A. That is, in the detection device 302A, the sheet heater 310 is interposed between the collimator 303 and the sensor portion 10.

In the second embodiment, the sheet heater 310 is located on a path of the light entering the photodiode PD from the collimator 303 side. Therefore, the sheet heater 310 of the second embodiment has a light-transmitting property. Such a sheet heater 310 can be obtained by employing, as a material, an electrically conductive material that exhibits the light-transmitting property, such as ITO or IZO mentioned above. As described above, the detection device 302A of the second embodiment is the same as the detection device 302 of the first embodiment except in the respects otherwise explained.

Third Embodiment

Figure 17:
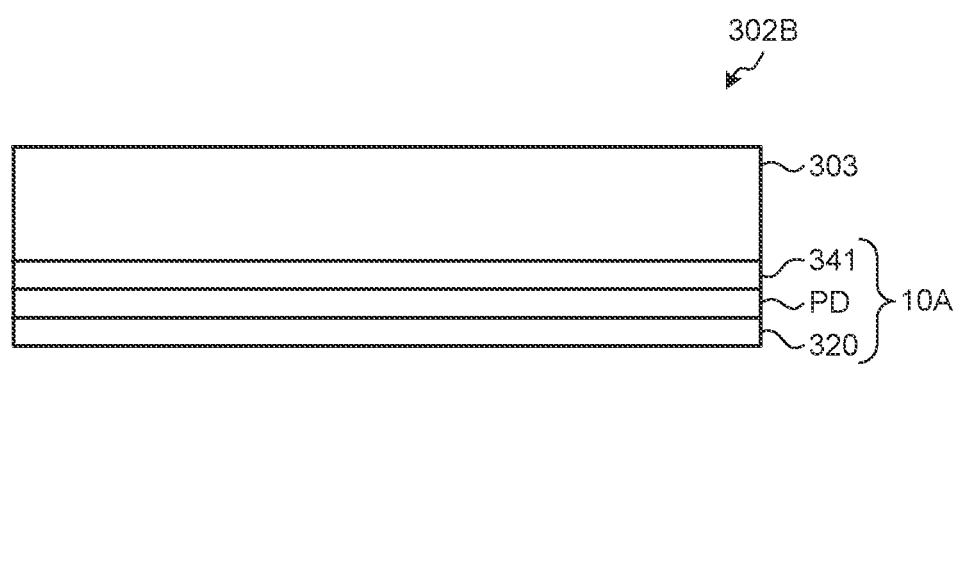
FIG. 17 is a side view illustrating a multilayered structure of a detection device according to a third embodiment.

FIG. 17 is a side view illustrating a multilayered structure of a detection device 302B according to a third embodiment. The detection device 302B has the multilayered structure in which a sensor portion 10A and the collimator 303 are stacked in this order from one surface side toward the other surface side of the detection device 302B. The sensor portion 10A has a multilayered structure in which the circuit board 320, the photodiode PD, and a dual-use electrode 341 are stacked in this order from one surface side toward the other surface side of the sensor portion 10A. The dual-use electrode 341 has a configuration obtained by integrating the sheet heater 310 of the second embodiment described with reference to FIG. 16 with the common electrode 322 of the first embodiment described with reference to FIGS. 1 to 15.

Figure 18:
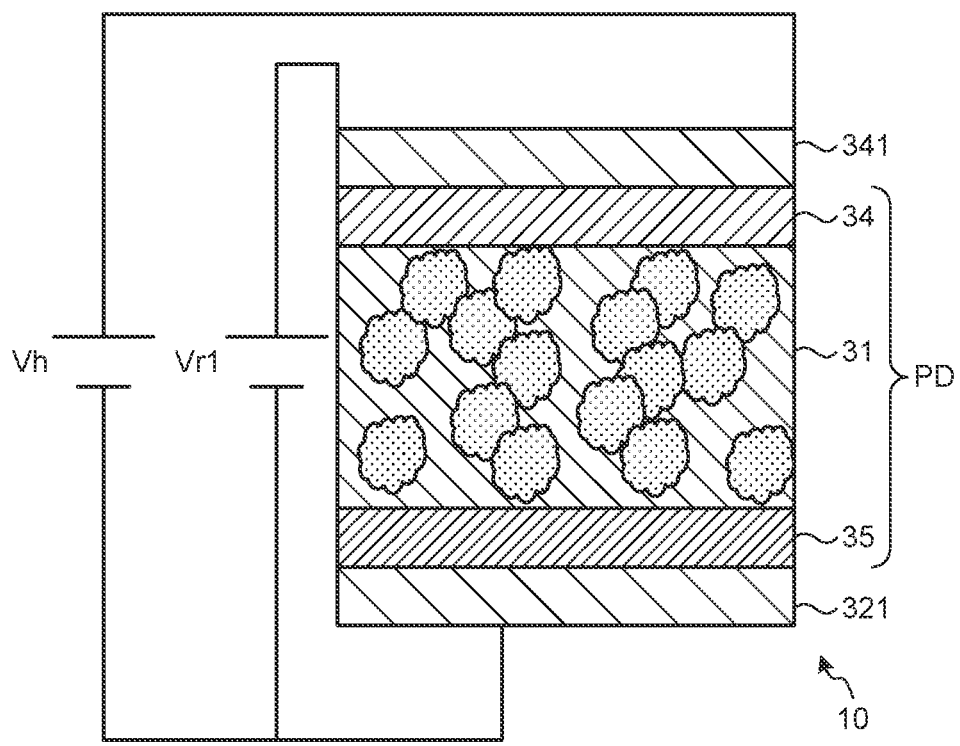
FIG. 18 is a schematic view illustrating a mechanism of controlling a voltage applied to a dual-use electrode.

FIG. 18 is a schematic view illustrating a mechanism of controlling a voltage applied to the dual-use electrode 341. As illustrated in FIG. 18, in the third embodiment, a variable voltage Vh is provided, in addition to the voltage Vr1 described with reference to FIG. 12, so as to be applicable to the dual-use electrode 341. The dual-use electrode 341 is coupled to the voltage Vr1 on one end side in the extension direction thereof, and to the variable voltage Vh on the other end side thereof. The voltage applied from the source of the variable voltage Vh is determined by the power supply circuit 123 under the control of the control circuit 122.

During the sensing, the control circuit 122 causes the dual-use electrode 341 to function in the same way as the common electrode 322 described above. Specifically, during the sensing, the control circuit 122 sets the variable voltage Vh to the same voltage as the voltage Vr1. This operation causes the voltage Vr1 and the variable voltage Vh to give the common electrode 322 the potential of the voltage Vr1 in a parallel relation to each other.

When causing the dual-use electrode 341 to function in the same way as the sheet heater 310 described above, the control circuit 122 sets the variable voltage Vh to a voltage Vr2 different from the voltage Vr1. This operation causes a current to flow through the dual-use electrode 341 correspondingly to the potential difference between the voltage Vr1 and the variable voltage Vh. The dual-use electrode 341 is heated by the current, and functions in the same way as the sheet heater 310 described above. In the third embodiment, when causing the dual-use electrode 341 to function in the same way as the sheet heater 310 described above, the variable voltage Vh is set to a voltage (for example, 3 V) higher by 1 V than the voltage Vr1, or to a voltage (for example, 1 V) lower by 1 V than the voltage Vr1. However, the variable voltage Vh in the case of causing the dual-use electrode 341 to function in the same way as the sheet heater 310 described above is not limited to these voltages, and can be changed as appropriate according to various conditions such as the required heat generation performance.

Figure 19:
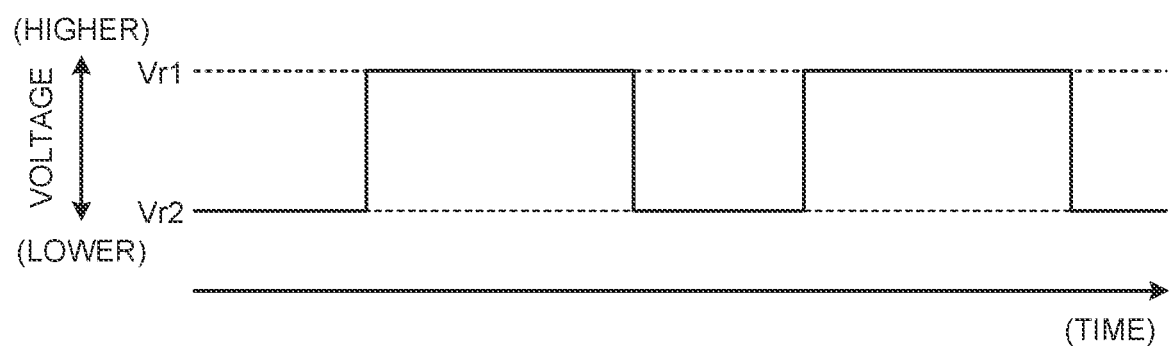
FIG. 19 is a timing diagram of a case where a period when the dual-use electrode functions in the same way as the sheet heater and a period when the dual-use electrode functions in the same way as a common electrode alternately occur.

FIG. 19 is a timing diagram of a case where a period when the dual-use electrode 341 functions in the same way as the sheet heater 310 and a period when the dual-use electrode 341 functions in the same way as the common electrode 322 alternately occur. FIG. 19 illustrates an example in which the voltage Vr2 is set to a voltage (for example, 1 V) lower by 1 V than the voltage Vr1.

In the timing diagram illustrated in FIG. 19, during periods when the voltage Vr2 differs from the voltage Vr1, the dual-use electrode 341 functions in the same way as the sheet heater 310 described above to heat the photodiode PD. In the timing diagram illustrated in FIG. 19, during periods when the voltage Vr2 is equal to the voltage Vr1, the dual-use electrode 341 functions in the same way as the circuit board 320 described above to apply a reverse bias to the photodiode PD.

Figure 20:
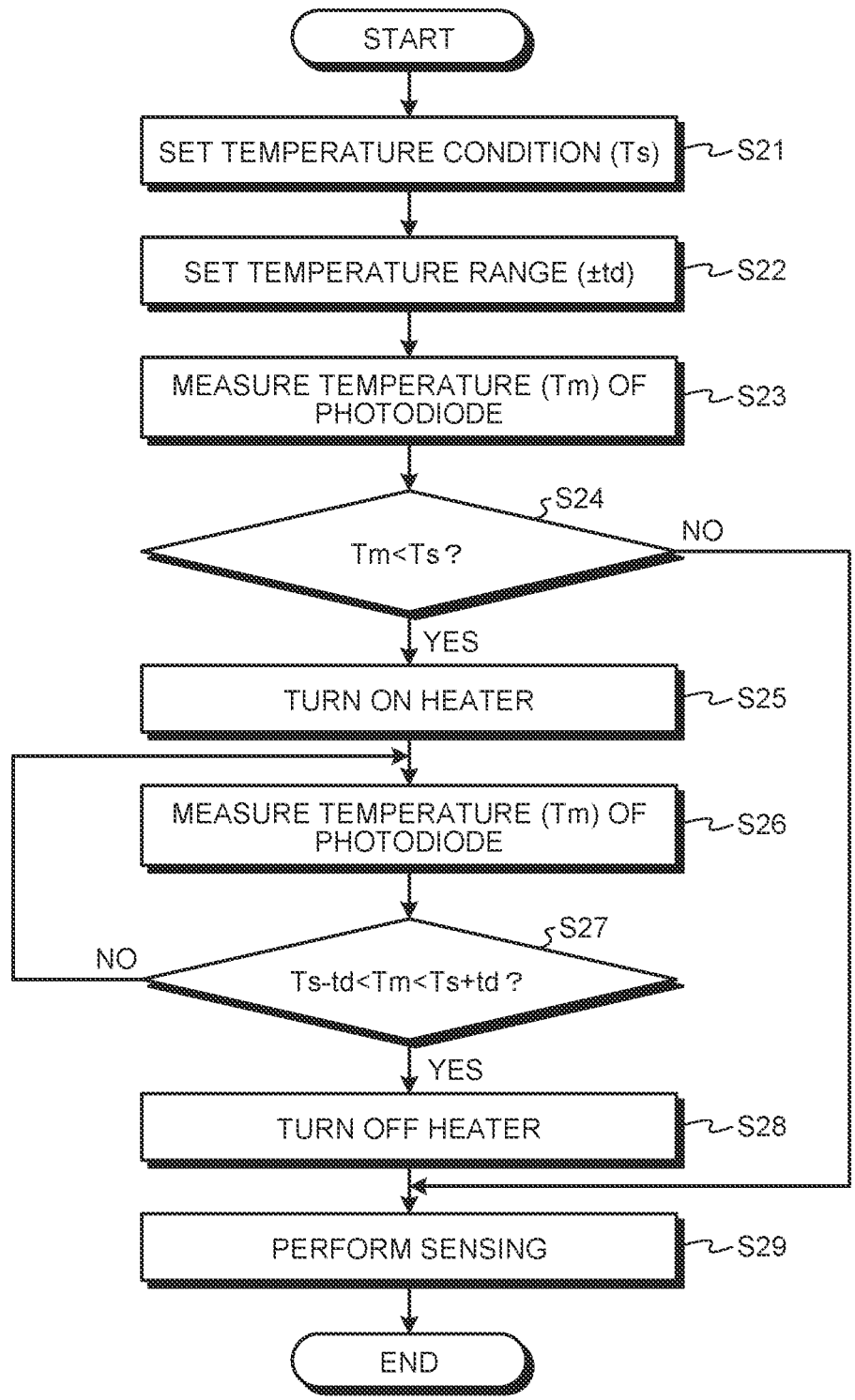
FIG. 20 is a flowchart illustrating a flow of main operation control of the detection device in the third embodiment.

FIG. 20 is a flowchart illustrating a flow of main operation control of the detection device 302B in the third embodiment. First, the control circuit 122 sets the temperature condition (Step S21). The processing at Step S21 is the same as the processing at Step S1 described above. The control circuit 122 sets the temperature range (Step S22). The processing at Step S22 is the same as the processing at Step S11 described above.

Then, the control circuit 122 measures the temperature of the photodiodes PD (Step S23). The processing at Step S23 is the same as the processing at Step S2 described above. The control circuit 122 determines whether the inequality Tm<Ts holds (Step S24). If the inequality Tm<Ts holds (Yes at Step S24), the control circuit 122 functions the dual-use electrode 341 in the same way as the sheet heater 310 (Step S25).

After performing the processing at Step S25, the control circuit 122 measures the temperature of the photodiodes PD (Step S26). After performing the processing at Step S26, the control circuit 122 determines whether the inequality Ts−td<Tm<Ts+Td holds (Step S27). Ts in the processing at Step S27 is Ts of the temperature condition (Ts° C.) set by the processing at Step S21. td in the processing at Step S27 is td of the temperature range (±td° C.) set by the processing at Step S22. Tm in the processing at Step S27 is Tm of the temperature (Tm° C.) of the photodiodes PD obtained by the processing at the latest step, Step S26. If the inequality Ts−td<Tm<Ts+Td holds (Yes at Step S27), the control circuit 122 stops causing the dual-use electrode 341 to function in the same way as the sheet heater 310 (Step S28), and causes the dual-use electrode 341 to function in the same way as the common electrode 322 to perform the sensing (Step S29). If the inequality Ts−td<Tm<Ts+Td does not hold (No at Step S27), the processing at Step S26 is performed again.

Any length of time may elapse until the processing at Step S26 is performed after the processing at Step S25, and any length of time may elapse until the processing at Step S26 is performed again if the inequality Ts−td<Tm<Ts+Td does not hold in the processing at Step S27 (No at Step S27). However, the length of the elapsed time is preferably set in advance to an appropriate length of time based on, for example, measurement made in advance. For example, the elapsed time is preferably a time (within a range of two to three seconds, for example) having a length in which the temperature of the photodiodes PD is considered to be significantly increased by being heated by the dual-use electrode 341 that functions in the same way as the sheet heater 310.

If the inequality Tm<Ts does not hold in the processing at Step S24 (No at Step S24), the control circuit 122 performs the sensing (Step S29). As described above, the detection device 302B of the third embodiment is the same as the detection device 302A of the second embodiment except in the respects otherwise explained.

Fourth Embodiment

Figure 21:
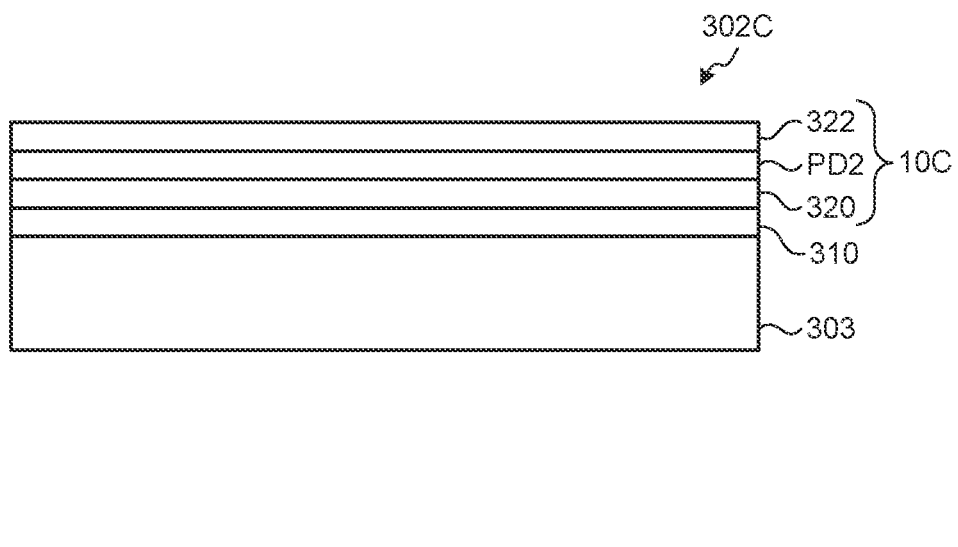
FIG. 21 is a side view illustrating a multilayered structure of a detection device according to a fourth embodiment.

FIG. 21 is a side view illustrating a multilayered structure of a detection device 302C according to a fourth embodiment. The detection device 302C has the multilayered structure in which the collimator 303, the sheet heater 310, and a sensor portion 10C are stacked in this order from one surface side toward the other surface side of the detection device 302C. The sensor portion 10C has a multilayered structure in which the circuit board 320, a photodiode PD2, and the common electrode 322 are stacked in this order from one surface side toward the other surface side of the sensor portion 10C. The photodiode PD2 in the sensor portion 10C is the same as the photodiode PD except that the positional relations of the anode and the cathode with the individual electrode 321 and the common electrode 322 are reversed from those of the photodiode PD described above. The sensor portion 10C is the same as the sensor portion 10 except that the photodiode PD2 is provided instead of the photodiode PD between the circuit board 320 and the common electrode 322.

Figure 22:
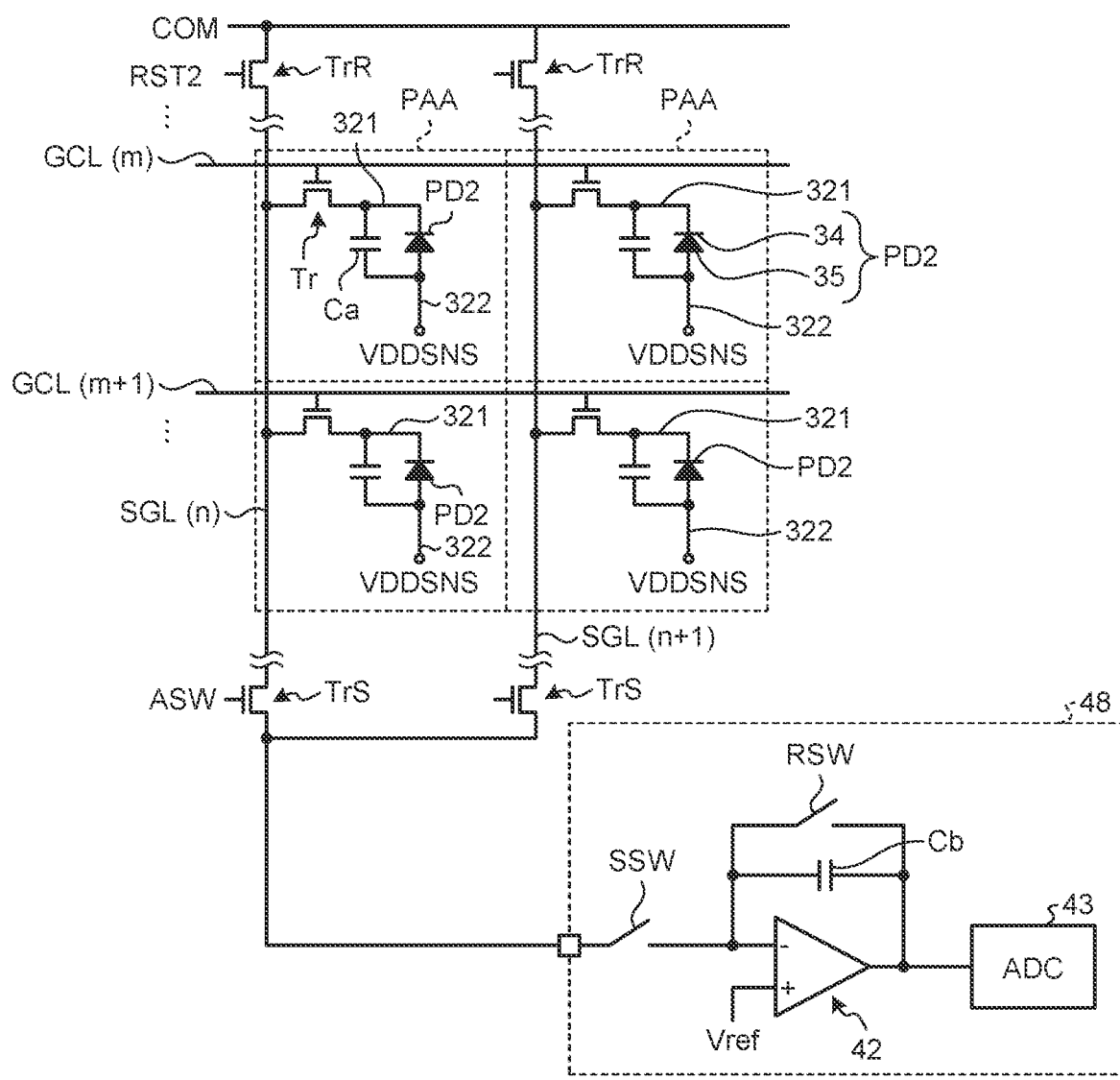
FIG. 22 is a circuit diagram illustrating a plurality of partial detection areas PAA in the fourth embodiment.
Figure 23:
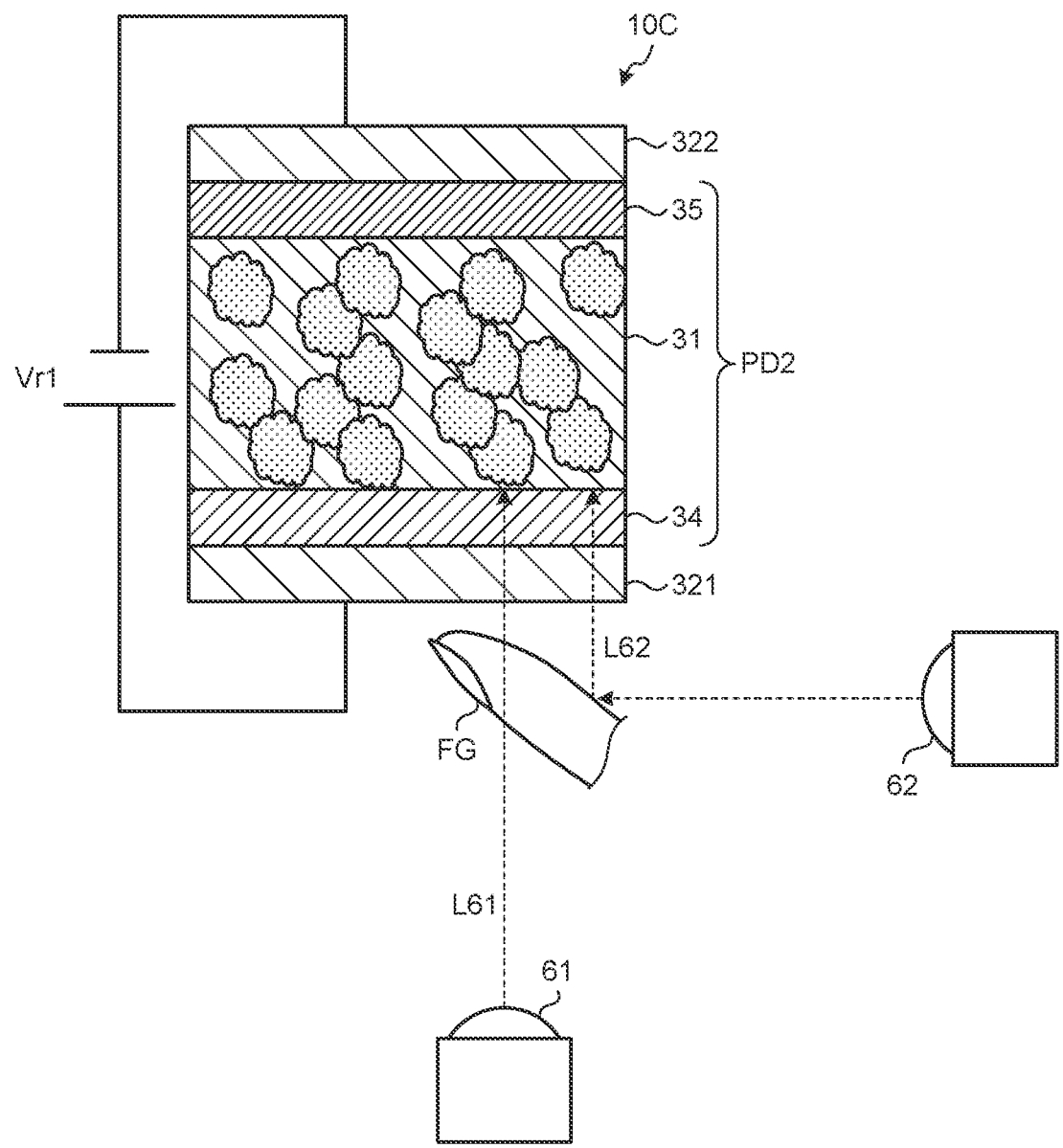
FIG. 23 is a schematic view illustrating a mechanism of detection by a sensor portion C of the fourth embodiment.

FIG. 22 is a circuit diagram illustrating the partial detection areas PAA in the fourth embodiment. FIG. 23 is a schematic view illustrating the mechanism of the detection by the sensor portion 10C of the fourth embodiment. As illustrated in FIGS. 22 and 23, in the fourth embodiment, the individual electrode 321 is coupled to the cathode of the photodiode PD2, in contrast to the first embodiment. The common electrode 322 is coupled to the anode of the photodiode PD2. Accordingly, the individual electrode 321 contacts the electron transport layer 34, and the common electrode 322 contacts the hole transport layer 35.

In the fourth embodiment, unlike in the first embodiment, the high-low relation of a relative voltage between the individual electrode 321 and the common electrode 322 for giving the photodiode PD the voltage Vr1 applied by the sensor power supply signal VDDSNS described above is reversed from that of the first embodiment. Specifically, the voltage Vr1 causes a relatively higher voltage to be applied to the individual electrode 321 and a relatively lower voltage to be applied to the common electrode 322. Thus, in also the fourth embodiment, the voltage Vr1 acts as a reverse bias to the photodiode PD2.

As illustrated in FIG. 21, the collimator 303 of the fourth embodiment is located on the circuit board 320 side. Accordingly, as illustrated in FIG. 23, the light (for example, light L61 and L62) to be detected by the photodiode PD in the fourth embodiment enters from the individual electrode 321 side. Therefore, the individual electrode 321 is preferably formed of an electrically conductive material that exhibits the light-transmitting property, such as ITO or IZO.

In the fourth embodiment, in the same manner as in the second embodiment described above, the sheet heater 310 is located on a path of the light entering the photodiode PD2 from the collimator 303 side. Therefore, the sheet heater 310 of the fourth embodiment has a light-transmitting property in the same manner as that of the second embodiment. Such a sheet heater 310 can be obtained by employing, as a material, an electrically conductive material that exhibits the light-transmitting property, such as ITO or IZO mentioned above.

In the fourth embodiment, the collimator 303 is located on one surface side of the photodiode PD2, and in addition, the substrate 301 is located on one surface side of the collimator 303. Therefore, the substrate 301 of the fourth embodiment preferably has the light-transmitting property. Specifically, the substrate 301 of the fourth embodiment is, for example, a glass substrate or a light-transmitting flexible substrate. As described above, the detection device 302C of the fourth embodiment is the same as the detection device 302 of the first embodiment except in the respects otherwise explained.

Fifth Embodiment

Figure 24:
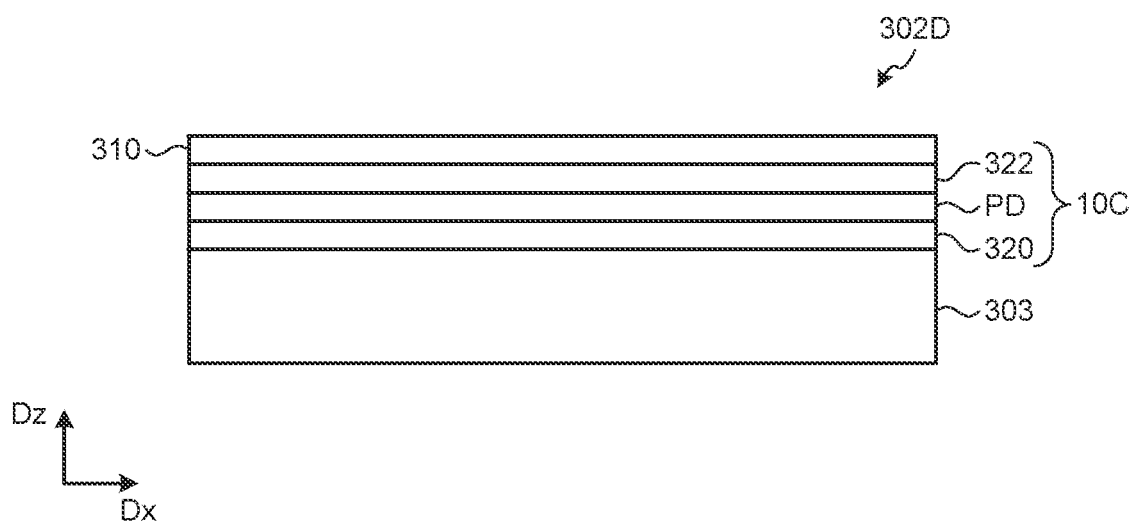
FIG. 24 is a side view illustrating a multilayered structure of a detection device according to a fifth embodiment.

FIG. 24 is a side view illustrating a multilayered structure of a detection device 302D according to a fifth embodiment. The detection device 302D has the multilayered structure in which the collimator 303, the sensor portion 10C, and the sheet heater 310 are stacked in this order from one surface side toward the other surface side of the detection device 302D.

The sheet heater 310 of the fifth embodiment is not located on the path of the light reaching the photodiode PD2 from the collimator 303 side. Accordingly, the sheet heater 310 of the fifth embodiment does not necessarily need to be formed of a light-transmitting material. The sheet heater 310 of the fifth embodiment may naturally be formed of a light-transmitting material. As described above, the detection device 302D of the fifth embodiment is the same as the detection device 302C of the fourth embodiment except in the respects otherwise explained.

Modification of Fifth Embodiment

Figure 25:
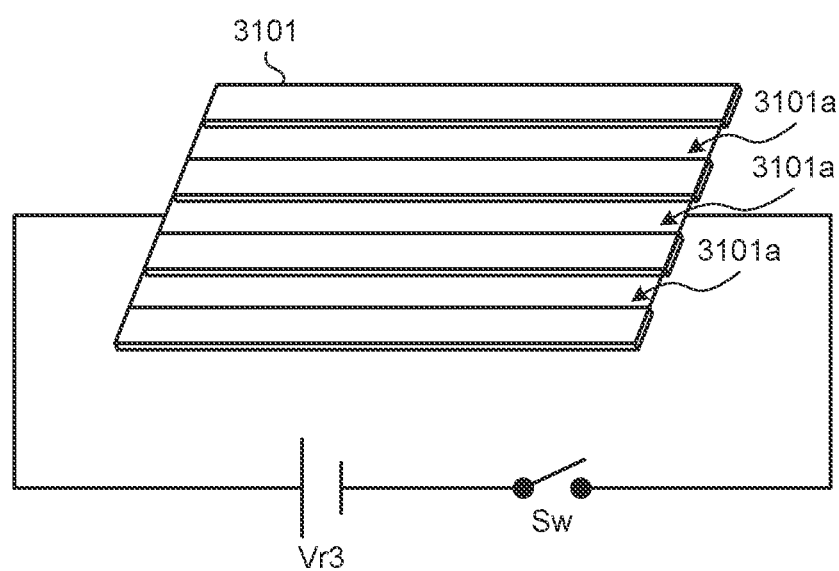
FIG. 25 is a schematic view illustrating a configuration example of the sheet heater.
Figure 26:
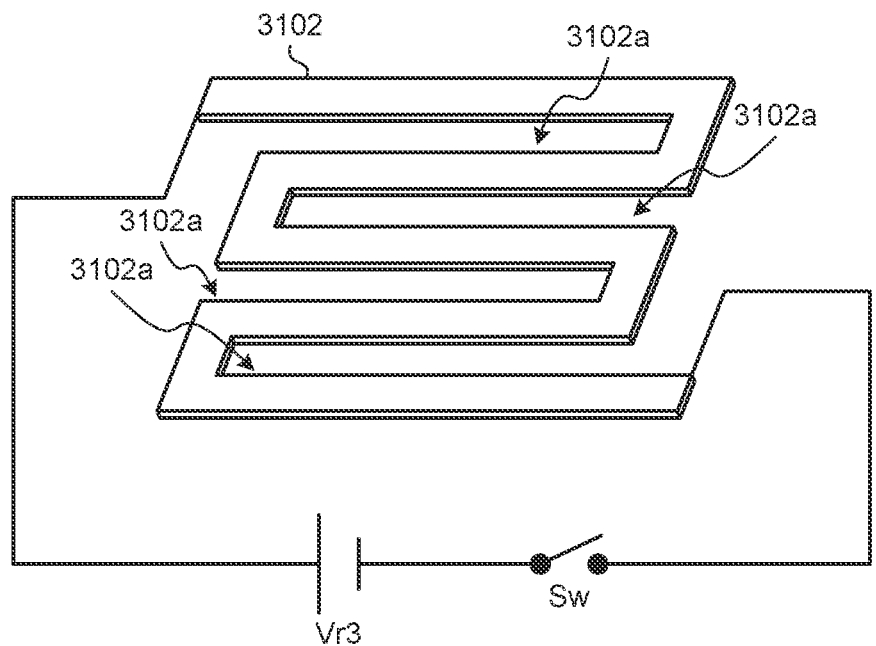
FIG. 26 is a schematic view illustrating a configuration example of the sheet heater.

The following describes a modification of the fifth embodiment with reference to FIGS. 25 and 26. In the modification of the fifth embodiment, strip-like electrodes 3101 illustrated in FIG. 25 or a belt-like electrode 3102 illustrated in FIG. 26 may be provided instead of the sheet heater 310.

FIG. 25 is a schematic view illustrating a configuration example of the strip-like electrodes 3101. As illustrated in FIG. 25, a component made of the strip-like electrodes 3101 arranged in parallel may be provided instead of the sheet heater 310. A plurality of slits 3101a may be provided in the sheet heater 310 to form the configuration illustrated in FIG. 25.

FIG. 26 is a schematic view illustrating a configuration example of the belt-like electrode 3102. As illustrated in FIG. 26, the belt-like electrode 3102 having a plurality of bent portions from one end to the other end thereof may be provided instead of the sheet heater 310. The bent portions in FIG. 26 may be curves. The configuration illustrated in FIG. 26 can also be formed by alternately forming slits 3102a in the sheet heater 310 so as not to fully divide the sheet heater 310.

The strip-like electrodes 3101 and the belt-like electrode 3102 have each the same heat-generating portion as the heat-generating portion of the sheet heater 310. In other words, the sheet-like configuration possessed by the sheet heater 310 may be replaced with the configuration illustrated in FIG. 25 or 26.

A voltage Vr3 illustrated in FIGS. 25 and 26 is a voltage (for example, 1 V) applied to the strip-like electrodes 3101 and the belt-like electrode 3102 to cause them to function as components for heating the photodiodes PD2 (or the photodiodes PD) in the same way as the sheet heater 310 described above. A switch Sw illustrated in FIGS. 25 and 26 schematically illustrates that the function of heating the photodiodes PD2 (or the photodiodes PD) by the strip-like electrodes 3101 and the belt-like electrode 3102 can be turned on and off. The control circuit 122 controls the switch Sw to be opened and closed.

While the modification of the fifth embodiment has been described with reference to FIGS. 25 and 26, the strip-like electrodes 3101 or the belt-like electrode 3102 described with reference to FIG. 25 or 26 may be employed as a component replacing the sheet heater 310 in the first embodiment.

Sixth Embodiment

Figure 27:
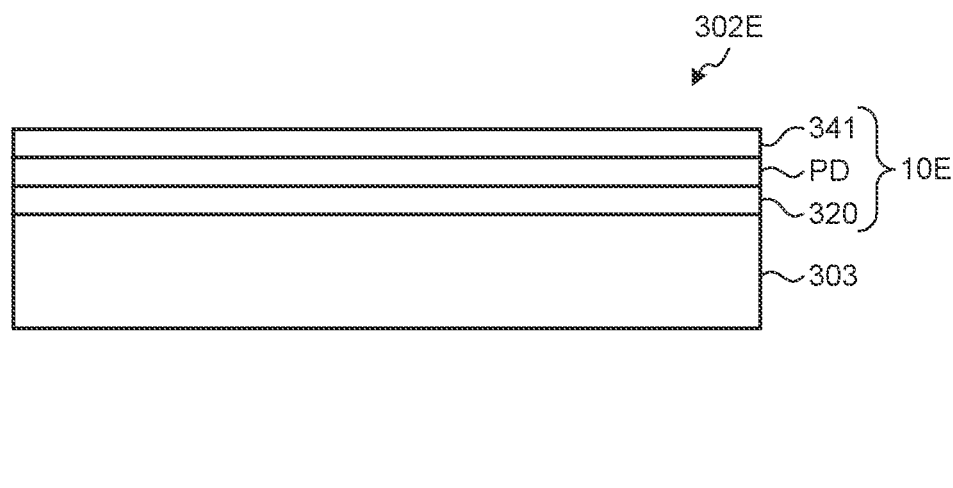
FIG. 27 is a side view illustrating a multilayered structure of a detection device according to a sixth embodiment.

FIG. 27 is a side view illustrating a multilayered structure of a detection device 302E according to a sixth embodiment. The detection device 302E has the multilayered structure in which the collimator 303 and a sensor portion 10E are stacked in this order from one surface side toward the other surface side of the detection device 302E. The sensor portion 10E has a multilayered structure in which the circuit board 320, the photodiode PD, and the dual-use electrode 341 are stacked in this order from one surface side toward the other surface side of the sensor portion 10E. The dual-use electrode 341 in the sixth embodiment has the same configuration as that of the dual-use electrode 341 in the third embodiment. However, just as the relation of the high-low level of the voltage Vr1 with the voltage between the individual electrode 321 and the common electrode 322 is reversed between the first embodiment and the fourth embodiment, the relation of the high-low level of the voltage Vr1 and the variable voltage Vh with the voltage between the individual electrode 321 and the dual-use electrode 341 is reversed between the third embodiment and the sixth embodiment. That is, in the sixth embodiment, a relatively higher voltage of the voltage Vr1 and the variable voltage Vh is applied to the individual electrode 321, and a relatively lower voltage is applied to the dual-use electrode 341. In other words, the detection device 302E of the sixth embodiment has a configuration obtained by replacing the common electrode 322 and the sheet heater 310 in the detection device 302D of the fifth embodiment with the dual-use electrode 341. The electrical resistance exhibited by a path of a current from the individual electrode 321 toward the dual-use electrode 341 through the photodiode PD is significantly higher than the electrical resistance of a path of a current between one end side and the other end side in the extending direction of the dual-use electrode 341. Therefore, even such coupling can conduct the current to the dual-use electrode 341. As an example, if the sheet resistance of the dual-use electrode 341 is approximately 40 Ω/sq, heat generation of approximately 0.1 W can be expected by causing a current flow of 50 mA.

Unlike in the fifth embodiment, the modification of the fifth embodiment is not applicable in the sixth embodiment. This is because the dual-use electrode 341 of the sixth embodiment functions also as the common electrode 322 for the individual electrode 321. As described above, the detection device 302E of the sixth embodiment is the same as the detection device 302D of the fifth embodiment except in the respects otherwise explained.

Seventh Embodiment

Figure 28:
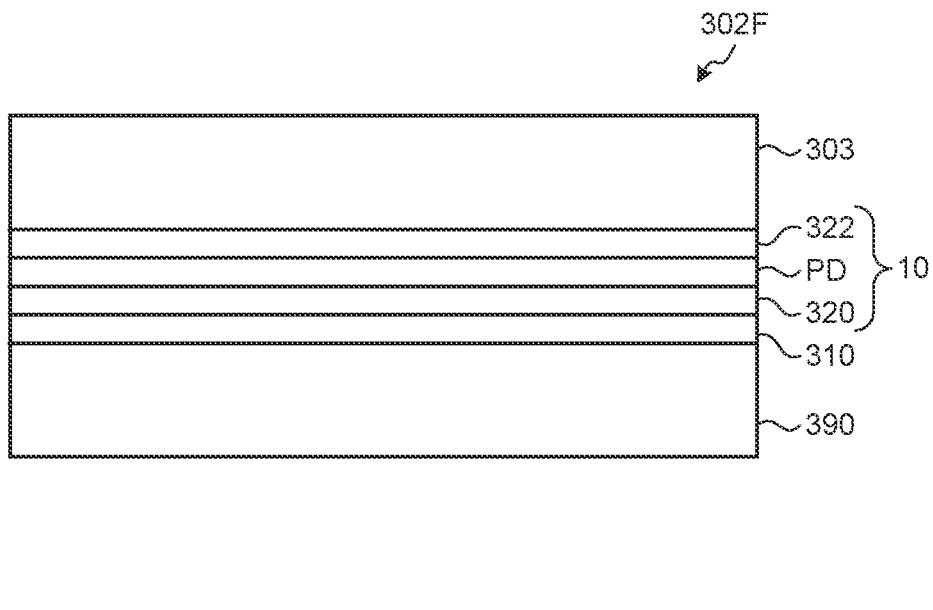
FIG. 28 is a side view illustrating a multilayered structure of a detection device according to a seventh embodiment.

FIG. 28 is a side view illustrating a multilayered structure of a detection device 302F according to a seventh embodiment. The detection device 302F has the multilayered structure in which a temperature detection light source 390, the sheet heater 310, the sensor portion 10, and the collimator 303 are stacked in this order from one surface side toward the other surface side of the detection device 302F. That is, the detection device 302F of the seventh embodiment is further provided with the temperature detection light source 390 on the one surface side of the detection device 302 of the first embodiment.

The temperature detection light source 390 includes a light source that irradiates the photodiode PD with light at a constant intensity. The light source is, for example, an LED, but is not limited thereto, and only needs to have a configuration capable of irradiating the photodiode PD with light at a constant intensity according to supply of power.

As illustrated in FIG. 28, the sheet heater 310 is interposed between the temperature detection light source 390 and the photodiode PD. Therefore, the sheet heater 310 of the seventh embodiment has a light-transmitting property in the same manner as in the second embodiment. The temperature detection light source 390 irradiates the photodiode PD with the light from the circuit board 320 side. Therefore, the individual electrode 321 of the sixth embodiment preferably has a light-transmitting property in the same manner as in the fourth embodiment.

Figure 29:
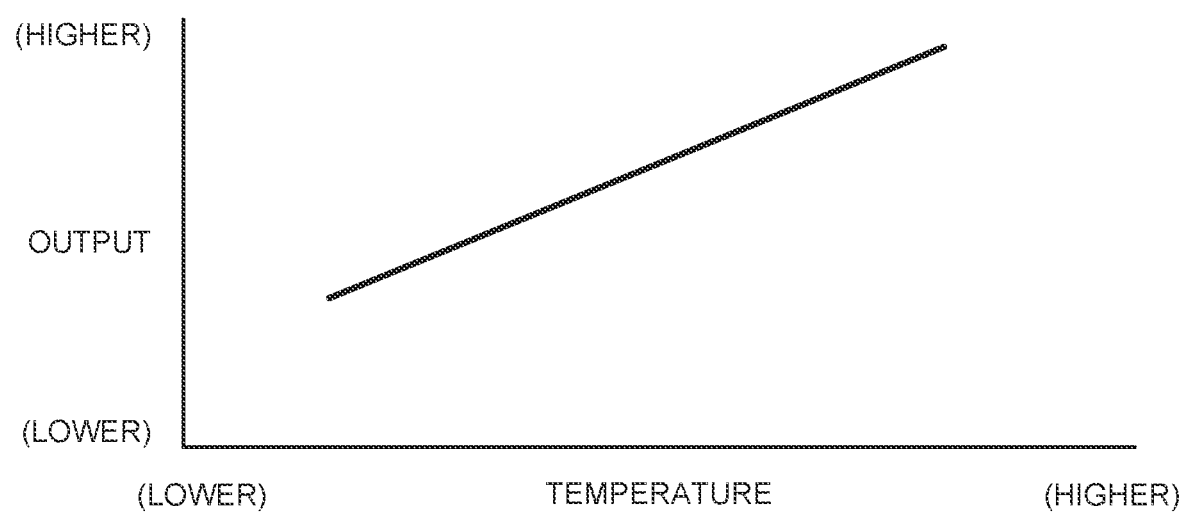
FIG. 29 is a graph illustrating a relation of an output of the photodiode receiving light from a temperature detection light source with the temperature of the photodiode.

FIG. 29 is a graph illustrating a relation of the output of the photodiode PD receiving the light from the temperature detection light source 390 with the temperature of the photodiode PD. As described above, the output of the photodiode PD exhibits the temperature dependence. Therefore, the high-low level of the output of the photodiode PD receiving the light at a constant intensity from the temperature detection light source 390 corresponds to the temperature of the photodiode PD. In other words, the temperature of the photodiode PD can be identified from the output of the photodiode PD under the condition of receiving the light at a constant intensity from the temperature detection light source 390. This is because increasing the temperature of the photodiode PD increases the output of the photodiode PD under the condition of receiving the light at a constant intensity from the temperature detection light source 390.

The temperature detection light source 390 is coupled to the control circuit 122 through an interface that is provided on the control substrate 121 correspondingly to the temperature detection light source 390 in a similar manner to the terminal 332 corresponding to the temperature detector 331, and is operated by being supplied with the power from the power supply circuit 123 under the control of the control circuit 122. In the seventh embodiment that includes the temperature detection light source 390, the temperature detector 331 and the terminal 332 can be eliminated. That is, data indicating the relation between the output of the photodiode PD and the temperature of the photodiode PD under the condition of receiving the light at a constant intensity from the temperature detection light source 390 is held in advance in the control circuit 122, or held in the external storage circuit (not illustrated) readable from the control circuit 122. The temperature of the photodiode PD can then be measured by including a lighting period during which the first and the second light sources 61 and 62 are not turned on and the temperature detection light source 390 is turned on in an operation period of the detection device 302F.

Figure 30:
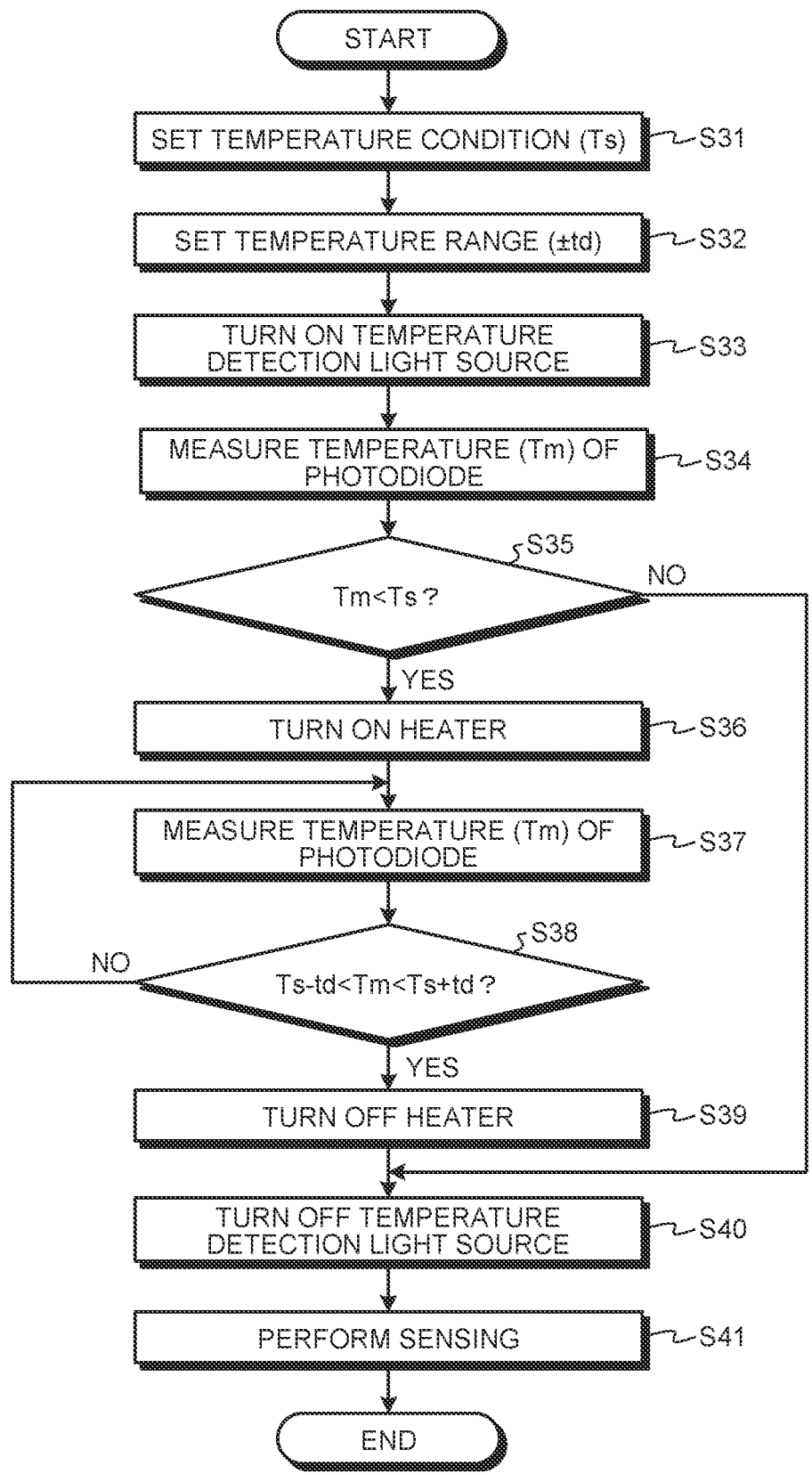
FIG. 30 is a flowchart illustrating a flow of main operation control of the detection device in the seventh embodiment.

FIG. 30 is a flowchart illustrating a flow of main operation control of the detection device 302F in the seventh embodiment. First, the control circuit 122 sets the temperature condition (Step S31). The processing at Step S31 is the same as the processing at Step S1 described above. The control circuit 122 sets the temperature range (Step S32). The processing at Step S32 is the same as the processing at Step S11 described above.

The control circuit 122 turns on the temperature detection light source 390 (Step S33). The control circuit 122 measures the temperature of the photodiode PD based on the output of the photodiode PD during the lighting period of the temperature detection light source 390 (Step S34). The control circuit 122 determines whether the inequality Tm<Ts holds (Step S35). If the inequality Tm<Ts holds (Yes at Step S35), the control circuit 122 operates the sheet heater 310 (Step S36).

After performing the processing at Step S36, the control circuit 122 measures the temperature of the photodiode PD (Step S37). The processing at Step S37 is performed because the light at a constant intensity has been continuously emitted from the temperature detection light source 390 that was turned on by the processing at Step S33.

The control circuit 122 determines whether the inequality Ts−td<Tm<Ts+Td holds (Step S38). Ts in the processing at Step S38 is Ts of the temperature condition (Ts° C.) set by the processing at Step S31. td in the processing at Step S38 is td of the temperature range (±td° C.) set by the processing at Step S32. Tm in the processing at Step S38 is Tm of the temperature (Tm° C.) of the photodiode PD obtained by the processing at the latest step, Step S37. If the inequality Ts−td<Tm<Ts+Td holds (Yes at Step S38), the control circuit 122 stops operating the sheet heater 310 (Step S39), turns off the temperature detection light source 390 (Step S40), and performs the sensing (Step S41). If the inequality Ts−td<Tm<Ts+Td does not hold (No at Step S38), the processing at Step S37 is performed again.

Any length of time may elapse until the processing at Step S37 is performed after the processing at Step S36, and any length of time may elapse until the processing at Step S37 is performed again if the inequality Ts−td<Tm<Ts+Td does not hold in the processing at Step S38 (No at Step S38). However, the length of the elapsed time is preferably set in advance to an appropriate length of time based on, for example, measurement made in advance. For example, the elapsed time is preferably a time (10 seconds, for example) having a length in which the temperature of the photodiode PD is considered to be significantly increased by being heated by the operation of the sheet heater 310.

If the inequality Tm<Ts does not hold in the processing at Step S35 (No at Step S35), the control circuit 122 performs the processing at Step S40, and then, performs the sensing (Step S41). As described above, the detection device 302F of the seventh embodiment is the same as the detection device 302 of the first embodiment except in the respects otherwise explained.

The temperature detection light source 390 of the seventh embodiment can also be provided in the second to the sixth embodiments. In the case of providing the temperature detection light source 390 in the second to the sixth embodiments, the temperature detection light source 390 only needs to be further stacked so as to establish a positional relation in which the temperature detection light source 390 faces the collimator 303 with the photodiode PD (or the photodiode PD2) interposed therebetween.

As described above, a detection device (detection device 302, 302A, 302B, 302C, 302D, 302E, or 302F) according to the present disclosure includes a photoelectric conversion portion (photoelectric conversion portion AA) in which a plurality of photodiodes (photodiodes PD or photodiodes PD2) are arranged in a planar shape, light sources (first light sources 61 and second light sources 62) that irradiate the photodiodes, and a heating electrode (sheet heater 310 or dual-use electrode 341) that is provided so as to face the photoelectric conversion portion and generates heat to be conducted to the photoelectric conversion portion.

According to the present disclosure, the heating electrode (sheet heater 310 or dual-use electrode 341) that generates heat to be conducted to the photoelectric conversion portion (photoelectric conversion portion AA) can heat the photodiodes (photodiodes PD or photodiodes PD2) arranged in the photoelectric conversion portion. That is, according to the present disclosure, the temperature of the photodiodes can be raised. Therefore, according to the present disclosure, a reduction in the output response of the photodiodes that can occur when the temperature is too low can be restrained. Thus, according to the present disclosure, the detection device (detection device 302, 302A, 302B, 302C, 302D, 302E, or 302F) capable of better ensuring the output response can be provided.

The detection device (detection device 302, 302A, 302B, 302C, 302D, 302E, or 302F) includes a circuit board (circuit board 320) including a plurality of electrodes (individual electrodes 321) individually coupled to the anode or the cathode of each of the photodiodes (photodiodes PD or photodiodes PD2). In the detection device (for example, the detection device 302), the heating electrode, the circuit board, and the photoelectric conversion portion are stacked in this order from one surface side toward the other surface side of the detection device, in a positional relation in which the circuit board is interposed between the heating electrode (sheet heater 310) and the photoelectric conversion portion (photoelectric conversion portion AA). The light sources (first light sources 61 and second light sources 62) are located on the other surface side of the photoelectric conversion portion (refer to FIGS. 12 and 18). With this configuration, the light (light L61 and L62) from the light sources (first light sources 61 and second light sources 62) can better reach the photoelectric conversion portion.

The detection device (for example, the detection device 302, 302A, or 302B) may be such that the anode of each of the photodiodes (photodiodes PD) is individually coupled to a plurality of electrodes (individual electrodes 321), and the detection device (for example, the detection device 302C, 302D, or 302E) may be such that the cathode of each of the photodiodes (photodiodes PD2) may be individually coupled to a plurality of electrodes (individual electrodes 321).

The detection device (for example, the detection device 302A or 302B) may be such that the circuit board, the photoelectric conversion portion, and the heating electrode are stacked in this order from one surface side toward the other surface side of the detection device in a positional relation in which the photoelectric conversion portion (photoelectric conversion portion AA) is interposed between the circuit board (circuit board 320) and the heating electrode (sheet heater 310 or dual-use electrode 341), and the light sources (first light sources 61 and second light sources 62) are located on the other surface side of the heating electrode.

The heating electrode (dual-use electrode 341) is coupled to either of the anodes and the cathodes of the photodiodes (photodiodes PD or photodiodes PD2) not coupled to the electrodes (individual electrodes 321), and is provided so as to be switchable between the voltage for operating the photodiodes and the voltage for generating the heat (refer to FIG. 18, for example).

The heating electrode may have slits (for example, slits 3101a or 3102a) as exemplified by the strip-like electrodes 3101 or 3102.

As exemplified by the detection device 302F, a temperature detection light source (temperature detection light source 390) may be provided at a location that differs from those of the light sources (first light sources 61 and second light sources 62) and does not allow an external object to enter a light path to the photoelectric conversion portion (photoelectric conversion portion AA), and the light sources and the temperature detection light source may be provided at locations facing each other with the photoelectric conversion portion interposed therebetween (refer, for example, to the relation of the location of the temperature detection light source 390 in FIG. 28 with the locations of the first and the second light sources 61 and 62 in FIG. 12). This configuration allows the temperature of the photoelectric conversion portion (photoelectric conversion portion AA) to be measured by turning on the temperature detection light source, as described above.

The light sources (first light sources 61 and second light sources 62) and the temperature detection light source (temperature detection light source 390) are turned on at different times, and the heating electrode operates until the output of the photodiodes (photodiodes PD) in response to the light at a constant intensity from the temperature detection light source reaches an output value at which the temperature of the photodiodes exceeds a predetermined temperature value. This configuration can restrain the output response of the photodiodes from decreasing by setting the predetermined temperature to a temperature at which the output response of the photodiodes can be sufficiently ensured.

The term "one side" and the term "other side" in the embodiments and the modification described above may be formally interchanged. That is, the term "one side" in the embodiments and the modification described above may be read as "other side", and the term "other side" in the embodiments and the modification described above may be read as "one side".

Other operational advantages accruing from the aspects described in the embodiments and the modification above that are obvious from the description herein or that are appropriately conceivable by those skilled in the art will naturally be understood as accruing from the present disclosure.

What is claimed is:
1. A detection device comprising:
a photoelectric conversion portion in which a plurality of photodiodes are arranged in a planar shape;
a light source configured to irradiate the photodiodes with light;
a heating electrode provided so as to face the photoelectric conversion portion, and configured to generate heat and conduct the heat to the photoelectric conversion portion; and
a circuit board including a plurality of electrodes individually coupled to an anode or a cathode of each of the photodiodes,
wherein the heating electrode is a dual use electrode which, during a first period, is used to generate and conduct the heat, and during a second period, is used as a common electrode, and the first period and the second period alternately occur,
the heating electrode, the circuit board, and the photoelectric conversion portion are stacked in this order from one surface side toward another surface side of the detection device in a positional relation in which the circuit board is interposed between the heating electrode and the photoelectric conversion portion, and
the light source is located on the other surface side of the photoelectric conversion portion.
2. The detection device according to claim 1, wherein the electrodes are individually coupled to the anode of each of the photodiodes.
3. The detection device according to claim 1, wherein the electrodes are individually coupled to the cathode of each of the photodiodes.
4. The detection device according to claim 1, wherein
the circuit board, the photoelectric conversion portion, and the heating electrode are stacked in this order from the one surface side toward the other surface side of the detection device in a positional relation in which the photoelectric conversion portion is interposed between the circuit board and the heating electrode, and
the light source is located on the other surface side of the heating electrode.
5. The detection device according to claim 1, wherein the heating electrode is coupled to either of the anodes and the cathodes of the photodiodes, the anodes or the cathodes that are coupled to the heating electrode being not coupled to the electrodes, and is provided so as to be switchable between a voltage for operating the photodiodes and a voltage for generating the heat.

6. The detection device according to claim 1, wherein the heating electrode has a slit.

7. A detection device comprising:
- a photoelectric conversion portion in which a plurality of photodiodes are arranged in a planar shape;
- a light source configured to irradiate the photodiodes with light;
- a heating electrode provided so as to face the photoelectric conversion portion, and configured to generate heat and conduct the heat to the photoelectric conversion portion; and
- a temperature detection light source at a location that differs from a location of the light source and does not allow an external object to enter a light path to the photoelectric conversion portion, wherein the heating electrode is a dual use electrode which, during a first period, is used to generate and conduct the heat, and during a second period, is used as a common electrode, and the first period and the second period alternately occur, and the light source and the temperature detection light source are provided at locations facing each other with the photoelectric conversion portion interposed between the light source and the temperature detection light source.

8. The detection device according to claim 7, wherein the light source and the temperature detection light source are configured to be turned on at different times, and the heating electrode is configured to operate until an output of the photodiodes in response to light at a constant intensity from the temperature detection light source reaches an output value at which temperature of the photodiodes exceeds a predetermined temperature value.

* * * * *